US009724906B2

(12) United States Patent
Itou et al.

(10) Patent No.: US 9,724,906 B2
(45) Date of Patent: Aug. 8, 2017

(54) DELAMINATION METHOD, DELAMINATION DEVICE, AND DELAMINATION SYSTEM

(71) Applicant: TOKYO ELECTRON LIMITED, Tokyo (JP)

(72) Inventors: Masanori Itou, Koshi (JP); Ryoichi Sakamoto, Koshi (JP); Takashi Sakaue, Kikuchi-gun (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 92 days.

(21) Appl. No.: 14/633,393

(22) Filed: Feb. 27, 2015

(65) Prior Publication Data
US 2015/0239227 A1    Aug. 27, 2015

(30) Foreign Application Priority Data

Feb. 27, 2014  (JP) .................................. 2014-036760

(51) Int. Cl.
*B32B 38/10* (2006.01)
*B32B 43/00* (2006.01)
(Continued)

(52) U.S. Cl.
CPC ...... *B32B 43/006* (2013.01); *H01L 21/67092* (2013.01); *H01L 21/6838* (2013.01);
(Continued)

(58) Field of Classification Search
CPC . B32B 38/10; B32B 43/006; Y10T 156/1132; Y10T 156/1168;
(Continued)

(56) References Cited

U.S. PATENT DOCUMENTS 6,077,383 A  *  6/2000  Laporte ............. H01L 21/67092
                                              156/701
6,436,226 B1 *  8/2002  Omi ........................ B26F 3/004
                                              156/239
(Continued)

FOREIGN PATENT DOCUMENTS

JP    2013-016579 A    1/2013
JP    2013-149655 A    8/2013
(Continued)

*Primary Examiner* — Mark A Osele
(74) *Attorney, Agent, or Firm* — Nath, Goldberg & Meyer; Jerald L. Meyer

(57) ABSTRACT

A delamination method for delaminating a laminated substrate which includes a first and a second substrates bonded to each other, includes: adjusting a position of the laminated substrate at a holding unit by a position adjusting unit and disposing the holding unit at a predetermined height position; disposing a sharp member of a delamination inducing unit at a predetermined height position; detecting a contact of the sharp member by bringing the sharp member into contact with a side surface of one end portion of the laminated substrate; inserting the sharp member into the side surface of the one end portion of the laminated substrate; and delaminating the second substrate from the first substrate by a plurality of suction movement units which sucks the second substrate of the laminated substrate to move the second substrate away from the first substrate.

15 Claims, 21 Drawing Sheets

(51) Int. Cl.
*H01L 21/67* (2006.01)
*H01L 21/683* (2006.01)

(52) U.S. Cl.
CPC ... *B32B 2457/14* (2013.01); *H01L 2221/6839* (2013.01); *Y10S 156/93* (2013.01); *Y10S 156/941* (2013.01); *Y10T 156/1132* (2015.01); *Y10T 156/1168* (2015.01); *Y10T 156/1179* (2015.01); *Y10T 156/1184* (2015.01); *Y10T 156/1944* (2015.01); *Y10T 156/1961* (2015.01); *Y10T 156/1967* (2015.01); *Y10T 156/1978* (2015.01)

(58) Field of Classification Search
CPC ......... Y10T 156/1184; Y10T 156/1944; Y10T 156/1961; Y10T 156/1967; Y10T 156/1978; Y10S 156/93; Y10S 156/941; H01L 2221/6839
See application file for complete search history.

(56) References Cited

U.S. PATENT DOCUMENTS

| | | | | |
|---|---|---|---|---|
| 6,653,205 B2 * | 11/2003 | Yanagita | ........... | H01L 21/67092 156/763 |
| 7,406,994 B2 * | 8/2008 | Martinez | ............. | B28D 5/0011 156/762 |
| 7,650,687 B2 * | 1/2010 | Woo | ................. | H01L 21/67092 140/105 |
| 7,740,735 B2 * | 6/2010 | Kerdiles | ................ | G01N 19/04 156/707 |
| 8,083,115 B2 * | 12/2011 | Rayssac | ............... | B28D 5/0011 156/254 |
| 8,360,129 B2 * | 1/2013 | Ebata | ..................... | B65H 41/00 156/714 |
| 8,449,710 B2 * | 5/2013 | Furuya | .................. | B32B 43/006 156/247 |
| 8,845,859 B2 * | 9/2014 | Ries | .................. | H01L 21/67092 156/714 |
| 8,920,601 B2 * | 12/2014 | Miki | ..................... | B32B 43/006 156/711 |
| 9,266,315 B2 * | 2/2016 | Iizuka | ................... | B32B 43/006 |
| 9,601,365 B2 * | 3/2017 | Honda | ............. | H01L 21/67092 |
| 2005/0150597 A1 * | 7/2005 | Henley | .................... | B28D 5/00 156/755 |
| 2013/0146228 A1 * | 6/2013 | Hirakawa | ............... | B32B 38/10 156/701 |
| 2014/0150981 A1 * | 6/2014 | Itou | ..................... | B32B 38/1858 156/714 |
| 2014/0332166 A1 * | 11/2014 | Honda | ............. | H01L 21/67092 156/708 |

FOREIGN PATENT DOCUMENTS

| | | |
|---|---|---|
| WO | 2011024689 A1 | 3/2011 |
| WO | 2013136982 A1 | 9/2013 |

\* cited by examiner

DELAMINATION METHOD, DELAMINATION DEVICE, AND DELAMINATION SYSTEM

CROSS-REFERENCE TO RELATED APPLICATION

This application claims the benefit of Japanese Patent Application No. 2014-036760, filed on Feb. 27, 2014, in the Japan Patent Office, the disclosure of which is incorporated herein in its entirety by reference.

TECHNICAL FIELD

The present disclosure relates to a delamination method for delaminating a laminated substrate into a first substrate and a second substrate, a delamination device for implementing the delamination method, and a delamination system provided with the delamination device.

BACKGROUND

In recent years, in a semiconductor device manufacturing process, semiconductor substrates such as a silicon wafer, a compound semiconductor wafer and the like become larger in diameter and thinner in thickness. A thin semiconductor substrate having a large diameter may suffer from a warp or crack during a transfer operation or grinding process. Thus, in the semiconductor device manufacturing process, the semiconductor substrate is reinforced by bonding a support substrate to the semiconductor substrate. Then, the reinforced semiconductor substrate is transferred or subjected to a grinding process. Subsequently, the support substrate is delaminated from the reinforced semiconductor substrate.

For example, a first holding unit may hold the semiconductor substrate while a second holding unit may hold the support substrate. Then, the support substrate may be delaminated from the reinforced semiconductor substrate by vertically moving a peripheral portion of the second holding unit.

In the method of the related art, the peripheral portion of the second holding unit is held only at one point and is moved vertically. Thus, force acts on the substrate only at one point in a delamination process. Accordingly, there still exists a need in the related art to improve the efficiency of a delamination process.

Such improvement of efficiency may be required even in a manufacturing process of an SOI (Silicon On Insulator) or the like, which accompanies delamination of substrates.

SUMMARY

Some embodiments of the present disclosure provide a delamination method, a delamination device and a delamination system, which are capable of efficiently performing a delamination process of a target substrate and a support substrate.

According to one embodiment of the present disclosure, there is provided a delamination method for delaminating a laminated substrate which includes a first substrate and a second substrate bonded to each other, including: adjusting, in a holding unit configured to hold the first substrate of the laminated substrate, a position of the laminated substrate at the holding unit by a position adjusting unit and then disposing the holding unit at a predetermined height position; disposing a sharp member of a delamination inducing unit at a predetermined height position, in the delamination inducing unit configured to form a delamination start part, in which the first substrate and the second substrate begin to be delaminated from each other, on a side surface of one end portion of the laminated substrate; detecting a contact of the sharp member by bringing the sharp member into contact with the side surface of the one end portion of the laminated substrate; inserting the sharp member into the side surface of the one end portion of the laminated substrate to form the delamination start part on the one end portion of the laminated substrate; and delaminating the second substrate from the first substrate by a plurality of suction movement units which sucks the second substrate of the laminated substrate and moves the second substrate away from the first substrate, such that delamination proceeds from the one end portion of the laminated substrate toward the other end portion thereof using the delamination start part as a starting point.

According to another embodiment of the present disclosure, there is provided a delamination device for delaminating a laminated substrate which includes a first substrate and a second substrate bonded to each other, including: a holding unit configured to hold the first substrate of the laminated substrate; a plurality of suction movement units configured to suck the second substrate of the laminated substrate and to move the second substrate away from the first substrate; a position adjusting unit configured to adjust a position of the laminated substrate at the holding unit; a delamination inducing unit provided with a sharp member and configured to form a delamination start part, in which the first substrate and the second substrate begin to be delaminated from each other, on a side surface of one end portion of the laminated substrate, by bringing the sharp member into contact with the side surface of the one end portion of the laminated substrate held in the holding unit; and a control device configured to control the holding unit, the plurality of suction movement units, the position adjusting unit and the delamination inducing unit so as to perform: adjusting a position of the laminated substrate held in the holding unit by the position adjusting unit and then disposing the holding unit at a predetermined height position; disposing the sharp member at a predetermined height position; detecting a contact of the sharp member by bringing the sharp member into contact with the side surface of the one end portion of the laminated substrate; inserting the sharp member into the side surface of the laminated substrate to form the delamination start part on the side surface of the one end portion of the laminated substrate; and delaminating the second substrate from the first substrate by the plurality of suction movement units such that delamination proceeds from the one end portion of the laminated substrate toward the other end portion thereof using the delamination start part as a starting point.

According to another embodiment of the present disclosure, there is provided a delamination system provided with the aforementioned delamination device, including: a first processing block configured to perform processes with respect to the laminated substrate and the first substrate; and a second processing block configured to perform processes with respect to the second substrate, wherein the first processing block includes a carry-in/carry-out station in which the laminated substrate and the first substrate are placed, a delamination station provided with the delamination device, and a first transfer region provided with a first transfer device which transfers the laminated substrate and the first substrate between the carry-in/carry-out station and the delamination station, and the second processing block includes a carry-out station in which the second substrate is placed, and a second transfer region provided with a second transfer device which transfers the second substrate with respect to the carry-out station.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

1. Delamination System

Figure 1:
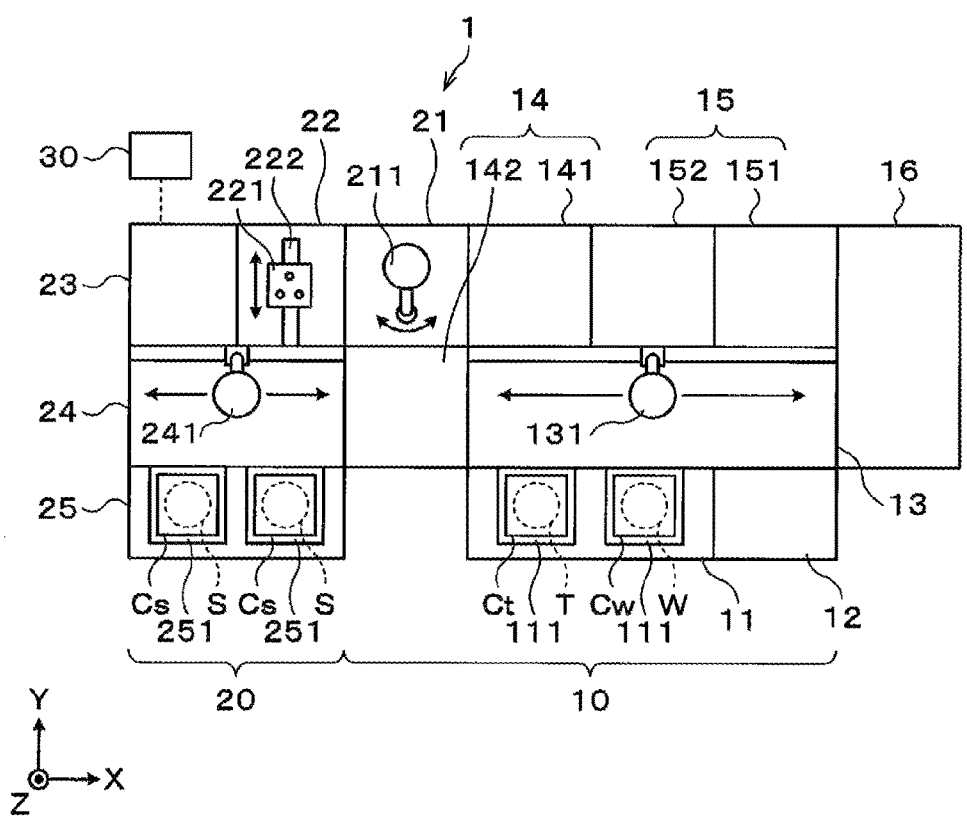
FIG. 1 is a schematic plan view showing a configuration of a delamination system according to the present embodiment.
Figure 2:
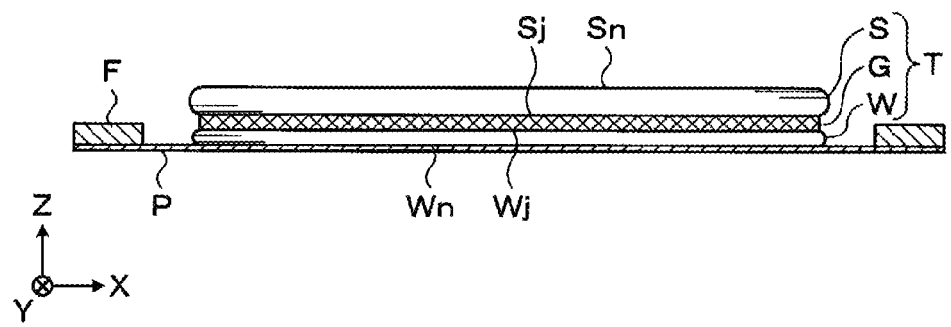
FIGS. 2 and 3 are schematic side views of a laminated substrate held by a dicing frame.
Figure 3:
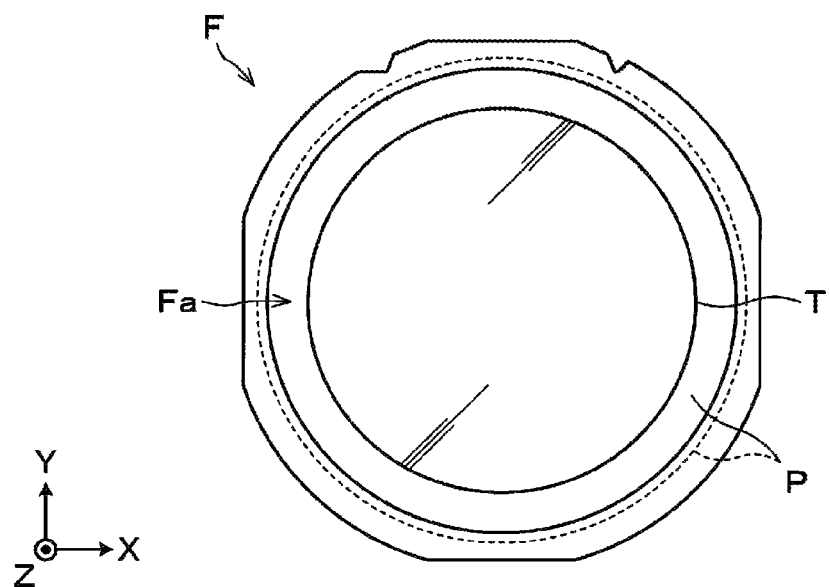

The configuration of a delamination system according to the present embodiment will be described with reference to FIGS. 1 to 3. FIG. 1 is a schematic plan view showing the configuration of the delamination system according to the present embodiment. FIG. 2 is a schematic side view showing a laminated substrate held by a dicing frame. FIG. 3 is a schematic plan view of the laminated substrate.

In the following description, an X-axis direction, a Y-axis direction and a Z-axis direction, which are orthogonal to one another, will be defined for the clarification of a positional relationship. A vertical upward direction will be a positive Z-axis direction.

The delamination system 1 of the present embodiment shown in FIG. 1 delaminates a laminated substrate T (see FIG. 2), in which a target substrate W as a first substrate and a support substrate S as a second substrate are bonded together by a bonding agent G, into the target substrate W and the support substrate S.

In the following description, as shown in FIG. 2, a surface of the target substrate W, which is bonded to the support substrate S by the bonding agent G, will be referred to as a "bonding surface Wj." Also, a surface opposite to the bonding surface Wj will be referred to as a "non-bonding surface Wn." Further, a surface of the support substrate S, which is bonded to the target substrate W by the bonding agent G, will be referred to as a "bonding surface Sj." In addition, a surface opposite to the bonding surface Sj will be referred to as a "non-bonding surface Sn."

The target substrate W is a substrate made by forming a plurality of electronic circuits on a semiconductor substrate, e.g., a silicon wafer or a compound semiconductor wafer. The surface of the target substrate W, on which the electronic circuits are formed, is the bonding surface Wj. Further, the target substrate W is made thin by, for example, grinding the non-bonding surface Wn. Specifically, the thickness of the target substrate W is from about 20 μm to about 50 μm.

The support substrate S has a diameter substantially equal to a diameter of the target substrate W and supports the target substrate W. The thickness of the support substrate S is from about 650 μm to about 750 μm. A silicon wafer, a glass substrate, or the like may be used as the support substrate S. The thickness of the bonding agent G used in bonding the target substrate W and the support substrate S is from about 40 μm to about 150 μm.

As shown in FIG. 3, the laminated substrate T is fixed to a dicing frame F. The dicing frame F is a substantially annular member having a central opening Fa larger in diameter than the laminated substrate T. The dicing frame F is made of metal such as stainless steel or the like. The thickness of the dicing frame F is, e.g., about 1 mm.

The laminated substrate T is fixed to the dicing frame F through a dicing tape P. Specifically, the laminated substrate T is positioned in the opening Fa of the dicing frame F. In addition, the dicing tape P is attached to the non-bonding surface Wn of the target substrate W and the rear surface of the dicing frame F so as to close the opening Fa from the rear surface. Thus, the laminated substrate T is fixed to (or held by) the dicing frame F.

Referring to FIG. 1, the delamination system 1 includes two processing blocks, i.e., a first processing block 10 and a second processing block 20. The first processing block 10 and the second processing block 20 are disposed side by side in an adjoining relationship along the X-axis direction, in the order of the second processing block 20 and the first processing block 10.

In the first processing block 10, the carry-in of the laminated substrate T, the delamination process of the laminated substrate T and the cleaning and carry-out of the delaminated target substrate W are performed. That is to say, the first processing block 10 is a block configured to perform processes for the substrate held by the dicing frame F (specifically, the laminated substrate T and the delaminated target substrate W). The first processing block 10 includes a carry-in/carry-out station 11, a standby station 12, a first transfer region 13, a delamination station 14, a first cleaning station 15 and an edge cut station 16.

The carry-in/carry-out station 11, the standby station 12, the delamination station 14, the first cleaning station 15 and the edge cut station 16 are arranged adjacent to the first transfer region 13. Specifically, the carry-in/carry-out station 11 and the standby station 12 are disposed side by side at the negative Y-axis direction of the first transfer region 13. One delamination device 141 of the delamination station 14 and two first cleaning devices 151 and 152 of the first cleaning station 15 are disposed side by side at the positive Y-axis direction of the first transfer region 13. The other delamination device 142 of the delamination station 14 is disposed at the negative X-axis direction of the first transfer region 13. The edge cut station 16 is disposed at the positive X-axis direction of the first transfer region 13.

A plurality of cassette placing tables 111 is installed in the carry-in/carry-out station 11. A cassette Ct configured to accommodate the laminated substrate T or a cassette Cw configured to accommodate the delaminated target substrate W is placed on each of the cassette placing tables 111. In the carry-in/carry-out station 11, the cassette Ct and the cassette Cw are carried in from the outside or carried out to the outside.

An ID reading device configured to read out, e.g., an ID (identification) of the dicing frame F is disposed in the standby station 12. The laminated substrate T under processing can be identified by the ID reading device. In addition to the aforementioned ID reading process, if necessary, a standby process of temporarily keeping the laminated substrate T in a standby state is performed in the standby station 12. A placing table, on which the laminated substrate T transferred by a below-mentioned first transfer device 131 is placed, is provided in the standby station 12. The ID reading device and a temporary standby unit are placed on the placing table.

A first transfer device 131 configured to transfer the laminated substrate T or the delaminated target substrate W is disposed in the first transfer region 13. The first transfer device 131 includes a transfer arm unit capable of moving in a horizontal direction, moving up and down in a vertical direction and swinging about a vertical axis, and a substrate holding unit installed at the tip of the transfer arm unit. In the first transfer region 13, a process of transferring the laminated substrate T to the standby station 12, the delamination station 14 and the edge cut station 16 and a process of transferring the delaminated target substrate W to the first cleaning station 15 and the carry-in/carry-out station 11 are performed by the first transfer device 131.

Two delamination devices 141 and 142 are disposed in the delamination station 14. In the delamination station 14, a delamination process of delaminating the laminated substrate T into the target substrate W and the support substrate S is performed by the delamination devices 141 and 142. Specifically, each of the delamination devices 141 and 142 delaminates the laminated substrate T into the target substrate W and the support substrate S in a state in which the target substrate W is disposed at the lower side and the support substrate S is disposed at the upper side. The number of the delamination devices disposed in the delamination station 14 is not limited to the present embodiment and may be arbitrarily set. While the delamination devices 141 and 142 of the present embodiment are disposed side by side in the horizontal direction, they may be stacked one above the other in the vertical direction.

Two first cleaning devices 151 and 152 are disposed in the first cleaning station 15. In the first cleaning station 15, a cleaning process of cleaning the delaminated target substrate W held in the dicing frame F is performed by the first cleaning devices 151 and 152. As the first cleaning devices 151 and 152, it may be possible to use, e.g., the cleaning device disclosed in Japanese Patent Application Publication No. 2013-016579. The number of the cleaning devices disposed in the first cleaning station 15 is not limited to the present embodiment and may be arbitrarily set. While the first cleaning devices 151 and 152 of the present embodiment are disposed side by side in the horizontal direction, they may be stacked one above the other in the vertical direction.

An edge cut device is disposed in the edge cut station 16. The edge cut device performs an edge cut process to remove a peripheral edge portion of the bonding agent G of the laminated substrate T by dissolving it with a solvent. By removing the peripheral edge portion of the bonding agent G by the edge cut process, it is possible to easily delaminate the target substrate W and the support substrate S in a delamination process which will be described later. The edge cut device is configured to dissolve the peripheral edge portion of the bonding agent G with a solvent of the bonding agent G by, for example, immersing the laminated substrate T into the solvent.

The cleaning and carry-out of the delaminated support substrate S is performed in the second processing block 20. That is to say, the second processing block 20 is a block which performs processes with respect to the substrate (the support substrate S) not held by the dicing frame F. The second processing block 20 includes a first delivery station 21, a second delivery station 22, a second cleaning station 23, a second transfer region 24 and a carry-out station 25.

The first delivery station 21 is disposed at the negative X-axis direction of the delamination device 141 of the delamination station 14 and disposed at the positive Y-axis direction of the delamination device 142. The second delivery station 22, the second cleaning station 23 and the carry-out station 25 are disposed adjacent to the second transfer region 24. Specifically, the second delivery station 22 and the second cleaning station 23 are disposed side by side at the positive Y-axis direction of the second transfer region 24. The carry-out station 25 is disposed at the negative Y-axis direction of the second transfer region 24.

In the first delivery station 21, a delivery process of receiving the delaminated support substrate S from each of the delamination devices 141 and 142 of the delamination station 14 and then delivering the delaminated support substrate S to the second delivery station 22 is performed. A delivery device 211 is disposed in the first delivery station 21. The delivery device 211 includes, e.g., a contactless holding unit such as a Bernoulli chuck or the like. The contactless holding unit is configured to rotate about a horizontal axis. Specifically, as the delivery device 211, it may be possible to use, e.g., the transfer device disclosed in Japanese Patent Application Publication No. 2013-016579. The delivery device 211 transfers the support substrate S from each of the delamination devices 141 and 142 to the second processing block 20 in a contactless manner while reversing the front and rear surfaces of the delaminated support substrate S.

In the second delivery station 22, there are disposed a placing unit 221 which supports the support substrate S and a movement unit 222 which moves the placing unit 221 in the Y-axis direction. The placing unit 221 is provided with, e.g., three support pins, and is configured to support the non-bonding surface Sn of the support substrate S. The movement unit 222 includes a rail extending in the Y-axis direction and a drive unit which moves the placing unit 221 in the Y-axis direction. In the second delivery station 22, the support substrate S is moved from the delivery device 211 of the first delivery station 21 and is placed on the placing unit 221. Thereafter, the placing unit 221 is moved toward the second transfer region 24 by the movement unit 222. Then, the support substrate S is delivered from the placing unit 221 to a below-mentioned second transfer device 241 of the second transfer region 24. In the present embodiment, the placing unit 221 is moved only in the Y-axis direction. However, the placing unit 221 may be configured to move in the X-axis direction as well as the Y-axis direction.

The delivery device 211 of the first delivery station 21 holds the support substrate S with a contactless holding unit such as a Bernoulli chuck or the like. Therefore, the transfer reliability of the delivery device 211 is not high. For that reason, if one attempts to directly deliver the support substrate S from the delivery device 211 to the below-mentioned second transfer device 241 of the second transfer region 24, there is a possibility that the support substrate S is dropped down. Accordingly, in the present embodiment, the second delivery station 22 is installed between the first delivery station 21 and the second transfer region 24, whereby the support substrate S is first placed in the second delivery station 22.

In the second cleaning station 23, there is disposed a second cleaning device which cleans the delaminated support substrate S. As the second cleaning device, it may be possible to use, e.g., the cleaning device disclosed in Japanese Patent Application Publication No. 2013-016579.

In the second transfer region 24, there is disposed a second transfer device 241 which transfers the delaminated support substrate S. The second transfer device 241 includes a transfer arm unit capable of moving in a horizontal direction, moving up and down in a vertical direction and swinging about a vertical axis, and a substrate holding unit installed at the tip of the transfer arm unit. In the second transfer region 24, a process of transferring the delaminated support substrate S to the carry-out station 25 is performed by the second transfer device 241.

In the carry-out station 25, there is installed a plurality of cassette placing tables 251. A cassette Cs configured to accommodate the delaminated support substrate S is placed on each of the cassette placing tables 251. In the carry-in/carry-out station 11, the cassette Cs is carried out to the outside.

The delamination system 1 further includes a control device 30. The control device 30 is a device configured to control the operation of the delamination system 1. The control device 30 is, for example, a computer, and includes a control unit (not shown) and a storage unit (not shown). The storage unit stores a program for controlling various processes such as the delamination process and the like. The control unit reads out and executes the program stored in the storage unit, thereby controlling the operation of the delamination system 1.

Further, the aforementioned program may be stored in a computer-readable recording medium and may be installed into the storage unit of the control device 30 from the computer-readable recording medium. The computer-readable recording medium may include, e.g., a hard disk (HD), a flexible disk (FD), a compact disk (CD), a magneto-optical disk (MOD), a memory card or the like.

Figure 4:
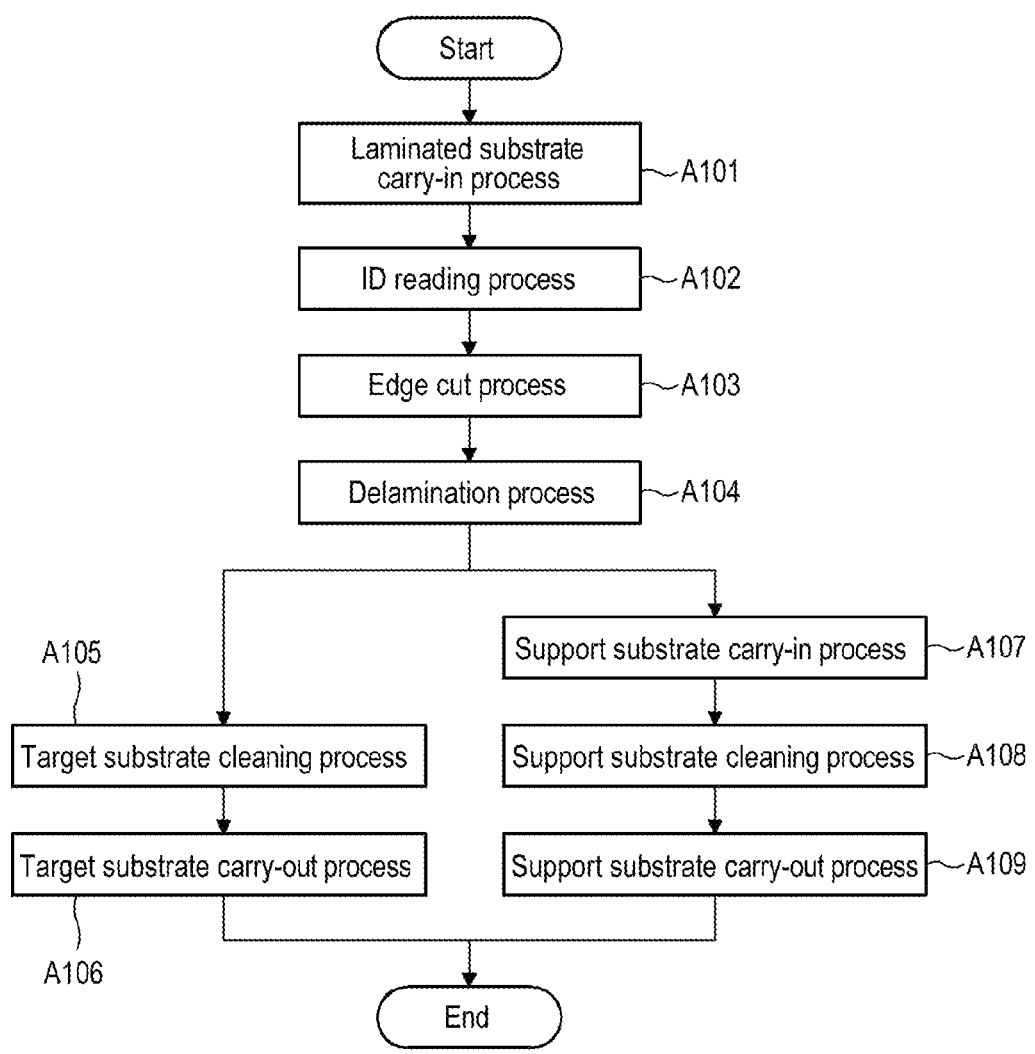
FIG. 4 is a flowchart showing a sequence of delamination processes performed by the delamination system.

Next, a description will be made on a delamination method of the target substrate W and the support substrate S performed using the delamination system 1 configured as above. FIG. 4 is a flowchart showing major steps of the delamination process. The delamination system 1 performs each processing operation shown in FIG. 4 under the control of the control device 30.

First, a cassette Ct containing a plurality of laminated substrates T and an empty cassette Cw are placed on specific cassette placing tables 111 of the carry-in/carry-out station 11. An empty cassette Cs is placed on a specific cassette placing table 251 of the carry-out station 25. Then, in the delamination system 1, the first transfer device 131 of the first processing block 10 takes out the laminated substrate T from the cassette Ct placed in the carry-in/carry-out station 11. At this time, the laminated substrate T is held in the substrate holding unit of the first transfer device 131 from above in a state in which the target substrate W is positioned at the lower side and the support substrate S is positioned at the upper side. Then, the first transfer device 131 performs a substrate carry-in process of carrying the laminated substrate T taken out from the cassette Ct into the standby station 12 (Step A101 in FIG. 4).

Subsequently, in the standby station 12, the ID reading device performs an ID reading process of reading out an ID of the dicing frame F (Step A102 in FIG. 4). The ID read out by the ID reading device is transmitted to the control device 30. Thereafter, the laminated substrate T is taken out from the standby station 12 by the first transfer device 131 and is carried into the edge cut station 16.

In the edge cut station 16, the edge cut device performs an edge cut process with respect to the laminated substrate T (Step A103 in FIG. 4). The peripheral edge portion of the bonding agent G is removed by the edge cut process. Thus, in the subsequent delamination process, the target substrate W and the support substrate S are easily delaminated. This makes it possible to shorten the time required in the delamination process.

As described above, in the delamination system 1 according to the present embodiment, the edge cut station 16 is installed within the first processing block 10. Thus, the laminated substrate T carried into the first processing block 10 can be directly carried into the edge cut station 16 through the use of the first transfer device 131. This makes it possible to enhance the throughput of a series of delamination processes. Moreover, it is possible to easily manage the time taken from the edge cut process to the delamination process and to stabilize the delamination performance.

In addition, for example, if a waiting laminated substrate T is generated due to a process time difference between the devices, the laminated substrate T can be kept on standby using the temporary standby unit installed in the standby station 12. This makes it possible to shorten the loss time between a series of steps.

Subsequently, the laminated substrate T subjected to the edge cut process is taken out from the edge cut station 16 by the first transfer device 131 and is carried into the delamination device 141 of the delamination station 14. In the delamination station 14, the delamination device 141 performs a delamination process with respect to the laminated substrate T (Step A104 in FIG. 4). By virtue of this delamination process, the laminated substrate T is separated into the target substrate W and the support substrate S.

Thereafter, in the delamination system 1, a process for the delaminated target substrate W is performed in the first processing block 10 and a process for the delaminated support substrate S is performed in the second processing block 20. The delaminated target substrate W is held by the dicing frame F.

In the first processing block 10, the delaminated target substrate W is taken out from the delamination device 141 of the delamination station 14 by the first transfer device 131 and is carried into the first cleaning device 151 of the first cleaning station 15. In the first cleaning station 15, the first cleaning device 151 performs a cleaning process with respect to the delaminated target substrate W (Step A105 in FIG. 4). The bonding agent G remaining on the bonding surface Wj of the target substrate W is removed by this cleaning process.

The cleaned target substrate W is taken out from the first cleaning device 151 of the first cleaning station 15 by the first transfer device 131 and is accommodated within the cassette Cw placed in the carry-in/carry-out station 11. Thereafter, the cassette Cw containing a plurality of target substrates W is carried out and recovered from the carry-in/carry-out station 11 (Step A106 in FIG. 4). Eventually, the process for the target substrate W is completed.

In the second processing block 20, a process for the delaminated support substrate S (Steps A107 to A109 to be described later) is performed in parallel with the processes of Steps A105 and A106.

In the second processing block 20, the delivery device 211 of the first delivery station 21 initially performs a delivery process of the delaminated support substrate S. Specifically, the delivery device 211 takes out the delaminated support substrate S from the delamination device 141 of the delamination station 14 and carries the delaminated support substrate S into the second delivery station 22 (Step A107 in FIG. 4).

In this regard, the delaminated support substrate S is kept in such a state that the upper surface, i.e., the non-bonding surface Sn, is held by the delamination device 141. The delivery device 211 holds the bonding surface Sj of the support substrate S from below in a contactless manner. Thereafter, the delivery device 211 reverses the support substrate S and places the support substrate S on the placing unit 221 of the second delivery station 22. As a result, the support substrate S is placed on the placing unit 221 with the bonding surface Sj thereof facing upward.

In the second delivery station 22, the placing unit 221, on which the support substrate S is placed, is moved by the movement unit 222 to a specified position existing at the side of the second transfer region 24. The specified position refers to a position where the transfer arm unit of the second transfer device 241 can receive the support substrate S placed on the placing unit 221.

Subsequently, the support substrate S is taken out from the second delivery station 22 by the second transfer device 241 and is carried into the second cleaning station 23. In the second cleaning station 23, the second cleaning device performs a cleaning process with respect to the delaminated support substrate S (Step A108 in FIG. 4). The bonding agent G remaining on the bonding surface Sj of the support substrate S is removed by this cleaning process.

The cleaned support substrate S is taken out from the second cleaning station 23 by the second transfer device 241 and is accommodated within the cassette Cs placed in the carry-out station 25. Thereafter, the cassette Cs containing a plurality of support substrates S is carried out and recovered from the carry-out station 25 (Step A109 in FIG. 4). Eventually, the process for the support substrate S is completed.

As described above, the delamination system 1 according to the present embodiment includes the first processing block 10 configured to perform the processes for the laminated substrate T and the target substrate W and the second processing block 20 configured to perform the processes for the support substrate S. Thus, the processes for the laminated substrate T and the target substrate W and the processes for the support substrate S can be performed in parallel. It is therefore possible to efficiently perform a series of substrate processing. More specifically, the delamination system 1 according to the present embodiment includes a front end (the carry-in/carry-out station 11 and the first transfer region 13) for the substrate (the laminated substrate T) held by the dicing frame F and the delaminated target substrate W, and a front end (the carry-out station 25 and the second transfer region 24) for the substrate (the delaminated support substrate S) not held by the dicing frame F. Thus, the process of transferring the target substrate W to the carry-in/carry-out station 11 and the process of transferring the support substrate S to the carry-out station 25 can be performed in parallel. Accordingly, it is possible to alleviate the transfer standby of the substrate in the related art and to enhance the throughput of the delamination process.

According to the present embodiment, even if the laminated substrate T and the target substrate W are held by the dicing frame F, the transfer of the laminated substrate T and the target substrate W held by the dicing frame F and the transfer of the support substrate S not held by the dicing frame F are respectively performed by individual transfer devices, i.e., the first transfer device 131 and the second transfer device 241. Accordingly, as compared with the related art in which a substrate held by a dicing frame and a substrate not held by a dicing frame are transferred by a single transfer device, it is possible in the present embodiment to simplify the control when transferring the laminated substrate T, the target substrate W and the support substrate S. This makes it possible to efficiently perform the delamination process.

In the delamination system 1 according to the present embodiment, the delamination station 14, the second cleaning station 23 and the second transfer region 24 are connected through the first delivery station 21 and the second delivery station 22. Thus, the delaminated support substrate S can be directly carried from the delamination station 14 into the second transfer region 24 without going through the first transfer region 13. It is therefore possible to smoothly perform the transfer of the delaminated support substrate S.

Moreover, the second delivery station 22 includes the placing unit 221 configured to support the support substrate S and the movement unit 222 configured to move the placing unit 221 in the horizontal direction. As a result, the placing unit 221 carrying the support substrate S can be moved when the support substrate S is delivered between the first delivery station 21 and the second transfer region 24. This eliminates the need to extend the contactless holding unit of the delivery device 211 of the first delivery station 21 or the transfer arm unit of the second transfer device 241 of the second transfer region 24. It is therefore possible to reduce the footprint of the first delivery station 21 and the second transfer region 24. This makes it possible to reduce the footprint of the delamination system 1 as a whole.

In the delamination system 1 described above, the first processing block 10 may include a mount device configured to attach the dicing frame F to the laminated substrate T. In this case, the laminated substrate T, to which the dicing frame F is not attached, is taken out from the cassette Ct and is carried into the mount device. In the mount device, the dicing frame F is attached to the laminated substrate T. Thereafter, the laminated substrate T fixed to the dicing frame F is transferred to the delamination station 14. The mount device may be disposed at an arbitrary position in the first processing block 10.

The first cleaning station 15 and the edge cut station 16 installed in the first processing block 10 of the delamination system 1 may be disposed outside the delamination system 1. Likewise, the second cleaning station 23 installed in the second processing block 20 may be disposed outside the delamination system 1.

In the delamination system 1 described above, the arrangement of the processing devices of the respective processing stations or the transfer regions may be arbitrarily designed. The processing devices of the respective processing stations or the transfer regions may be disposed side by side in the horizontal direction or may be stacked one above another in the vertical direction.

2. Configuration of Delamination Device

Figure 5:
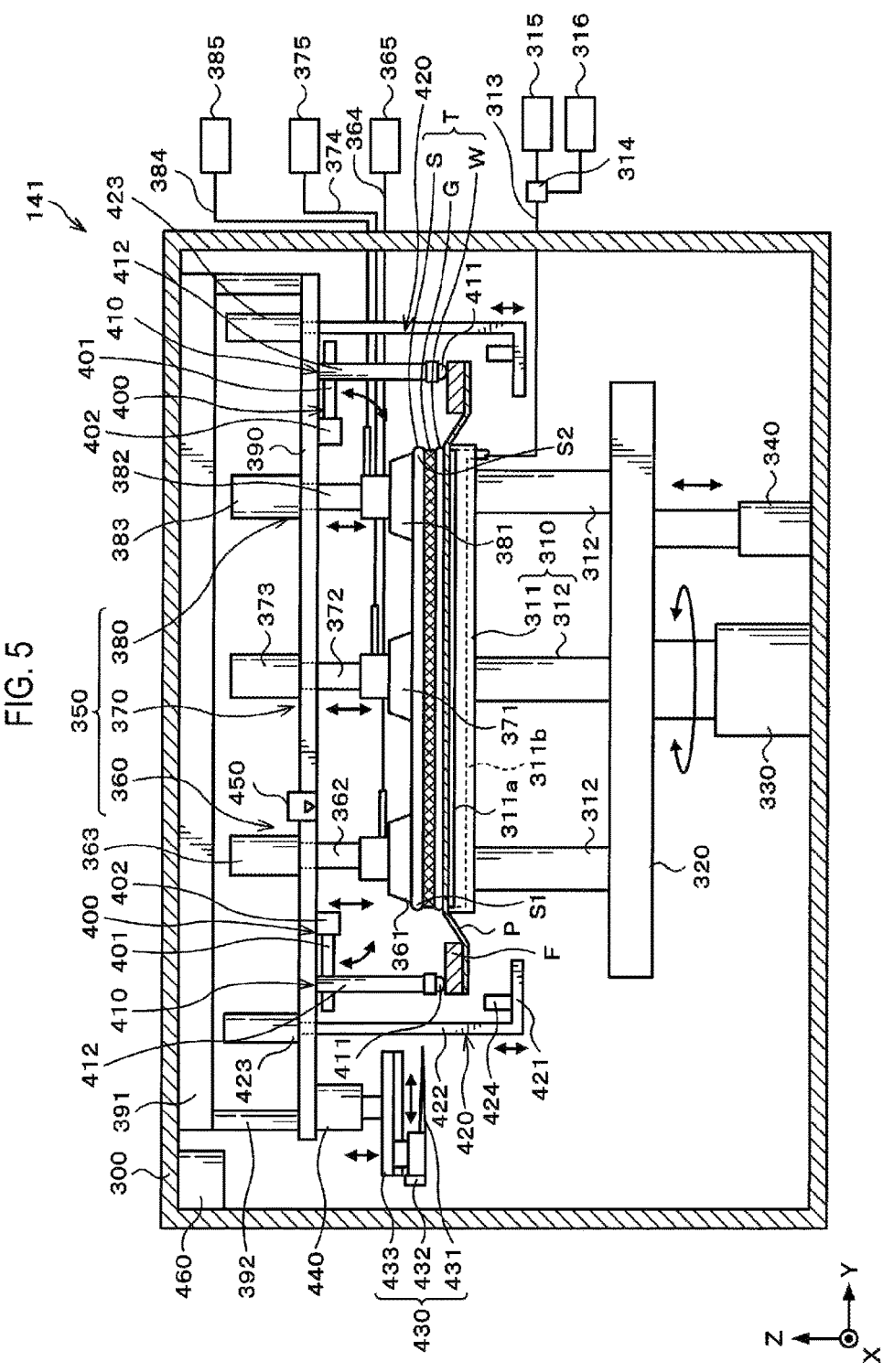
FIG. 5 is a vertical sectional view showing a schematic configuration of a delamination device.

Next, the configuration of the delamination devices 141 and 142 installed in the delamination station 14 will be described with reference to FIG. 5. FIG. 5 is a schematic side view showing the configuration of the delamination device 141 according to the present embodiment. The configuration of the delamination device 142 is the same as the configuration of the delamination device 141 and, therefore, will not be described.

As shown in FIG. 5, the delamination device 141 includes a processing container 300. A carry-in/carry-out gate (not shown), through which the target substrate W, the support substrate S and the laminated substrate T are carried in or out, is formed on the side surface of the processing container 300. An opening/closing shutter (not shown) is installed in the carry-in/carry-out gate.

Within the processing container 300, there are installed a first holding unit 310 as a holding unit, a lower base unit 320, a rotary mechanism 330, an elevator mechanism 340, a second holding unit 350, an upper base unit 390, position adjusting units 400, push-down units 410, delivery units 420, a delamination inducing unit 430, a movement adjusting unit 440, a measuring unit 450 and an ionizer 460.

The first holding unit 310 holds target substrate W of the laminated substrate T from below. The second holding unit 350 holds the support substrate S of the laminated substrate T from above. The first holding unit 310 is installed below the second holding unit 350. The target substrate W is disposed at the lower side and the support substrate S is disposed at the upper side. The second holding unit 350 moves the support substrate S away from the surface of the target substrate W, whereby the delamination device 141 delaminates the laminated substrate T into the support substrate S and the target substrate W. The respective components will now be described in detail.

For example, a porous chuck is used as the first holding unit 310. The first holding unit 310 includes a disc-shaped body portion 311 and a plurality of post members 312 configured to support the body portion 311. The post members 312 are supported on the lower base unit 320 which will be described later.

The body portion 311 is made of, e.g., a metallic material such as aluminum or the like. A suction surface 311a is formed on the front surface of the body portion 311. The suction surface 311a has a diameter substantially identical with a diameter of the laminated substrate T and makes contact with a lower surface of the laminated substrate T, i.e., a non-bonding surface $W_n$ of the target substrate W. The suction surface 311a is made of, e.g., a porous material such as silicon carbide or the like or porous ceramic.

A suction space 311b communicating with the outside through the suction surface 311a is formed within the body portion 311. A pipe 313 is connected to the suction space 311b. The pipe 313 is divided into two branch pipes at a valve 314. An intake device 315 such as a vacuum pump or the like is connected to one of the branch pipes of the pipe 313. In the intake device 315, there is installed a sensor (not shown) configured to measure an intake pressure of the intake device 315, namely a suction pressure available when sucking the target substrate W in the first holding unit 310. A gas supply source 316 which retains a gas, e.g., a nitrogen gas or an air, is connected to the other of the branch pipes of the pipe 313.

Using a negative pressure generated by the intake device 315, the first holding unit 310 causes the non-bonding surface $W_n$ of the target substrate W to be sucked to the suction surface 311a through a dicing tape P. Thus, the first holding unit 310 holds the target substrate W. Alternatively, the first holding unit 310 may inject a gas from the surface thereof and may support the target substrate W in a floating state. In the present embodiment, there is illustrated a case where the first holding unit 310 is a porous chuck. However, the first holding unit 310 may be, e.g., an electrostatic chuck or the like.

The lower base unit 320 is disposed below the first holding unit 310 to support the first holding unit 310. The lower base unit 320 is supported by the rotary mechanism 330 and the elevator mechanism 340, both of which are fixed to a floor surface of the processing container 300.

The rotary mechanism 330 rotates the lower base unit 320 about a vertical axis, whereby the first holding unit 310 supported on the lower base unit 320 is rotated. The elevator mechanism 340 moves the lower base unit 320 in the vertical direction, whereby the first holding unit 310 supported on the lower base unit 320 is moved up and down.

At the upper side of the first holding unit 310, the second holding unit 350 is disposed so as to face the first holding unit 310. The second holding unit 350 includes a plurality of suction movement units. Specifically, the second holding unit 350 includes a first suction movement unit 360, a second suction movement unit 370 and a third suction movement unit 380. The first to third suction movement units 360, 370 and 380 are supported by the upper base unit 390. The upper base unit 390 is supported by a fixing member 391 installed in a ceiling portion of the processing container 300, through posts 392.

The first suction movement unit 360 is configured to suck and hold the peripheral edge portion at a side of one end portion S1 of the support substrate S. The second suction movement unit 370 is configured to suck and hold a region positioned closer to the central portion of the support substrate S than the peripheral edge portion of the support substrate S. A plurality of, e.g., two, second suction movement units 370 are disposed side by side in the X-axis direction. The third suction movement unit 380 is configured to suck and hold the peripheral edge portion at a side of the other end portion S2 of the support substrate S. The first to third suction movement units 360, 370 and 380 independently move the sucked/held regions away from the surface of the target substrate W.

The first suction movement unit 360 includes a suction pad 361, a post member 362 and a movement mechanism 363. Furthermore, the second suction movement unit 370 includes a suction pad 371, a post member 372 and a movement mechanism 373. Likewise, the third suction movement unit 380 includes a suction pad 381, a post member 382 and a movement mechanism 383.

The suction pads 361, 371 and 381 are made of an elastic material such as rubber or the like. Intake ports (not shown) are formed in the respective suction pads 361, 371 and 381. Intake devices 365, 375 and 385 such as vacuum pumps or the like are connected to the respective intake ports through intake pipes 364, 374 and 384. In each of the intake devices 365, 375 and 385, there is installed a sensor (not shown) which measures an intake pressure thereof, namely a suction pressure available when each of the first to third suction movement units 360, 370 and 380 sucks the support substrate S.

The post members 362, 372 and 382 are configured to support the suction pads 361, 371 and 381 at the tip portions thereof. The base end portions of the post members 362, 372 and 382 are supported by the movement mechanisms 363, 373 and 383. The movement mechanisms 363, 373 and 383 are fixed to the upper portion of the upper base unit 390 and are configured to move the post members 362, 372 and 382 in the vertical direction.

The first to third suction movement units 360, 370 and 380 suck the support substrate S using the negative pressure generated by the air intake of the intake devices 365, 375 and 385. Thus, the first to third suction movement units 360, 370 and 380 hold the support substrate S.

While holding the support substrate S, the first to third suction movement units 360, 370 and 380 cause the respective movement mechanisms 363, 373 and 383 to move the post members 362, 372 and 382 and the suction pads 361, 371 and 381 in the vertical direction. Thus, this causes the support substrate S to move in the vertical direction.

In the second holding unit 350, the movement mechanism 363 is first operated. Then, the movement mechanism 373 is operated. Finally, the movement mechanism 383 is operated. That is to say, the second holding unit 350 initially pulls the peripheral edge portion at the side of the one end portion S1 of the support substrate S, then pulls the central portion of the support substrate S and finally pulls the peripheral edge portion at the side of the other end portion S2 of the support substrate S. Thus, the second holding unit 350 gradually and continuously delaminates the support substrate S from the target substrate W such that delamination proceeds from the one end portion S1 of the support substrate S toward the other end portion S2 thereof.

The position adjusting units 400 are disposed above the first holding unit 310. The laminated substrate T transferred to the delamination device 141 by the first transfer device 131 and held in the first holding unit 310 is adjusted in position or centered by the position adjusting units 400 so as to be positioned at a predetermined position (e.g., a position coinciding with the suction surface 311a).

The position adjusting units 400 are installed at a regular interval about the central portion of the laminated substrate T at positions, e.g., corresponding to three points of the outer circumference of the laminated substrate T shown in FIG. 3. The installed positions of the position adjusting units 400 are not limited to three points mentioned above. For example, the position adjusting units 400 may be installed at two points at the front and rear sides or the left and right sides of the outer circumference of the laminated substrate T. Alternatively, the position adjusting units 400 may be installed at four or more points at a regular interval about the central portion of the laminated substrate T.

Figure 6:
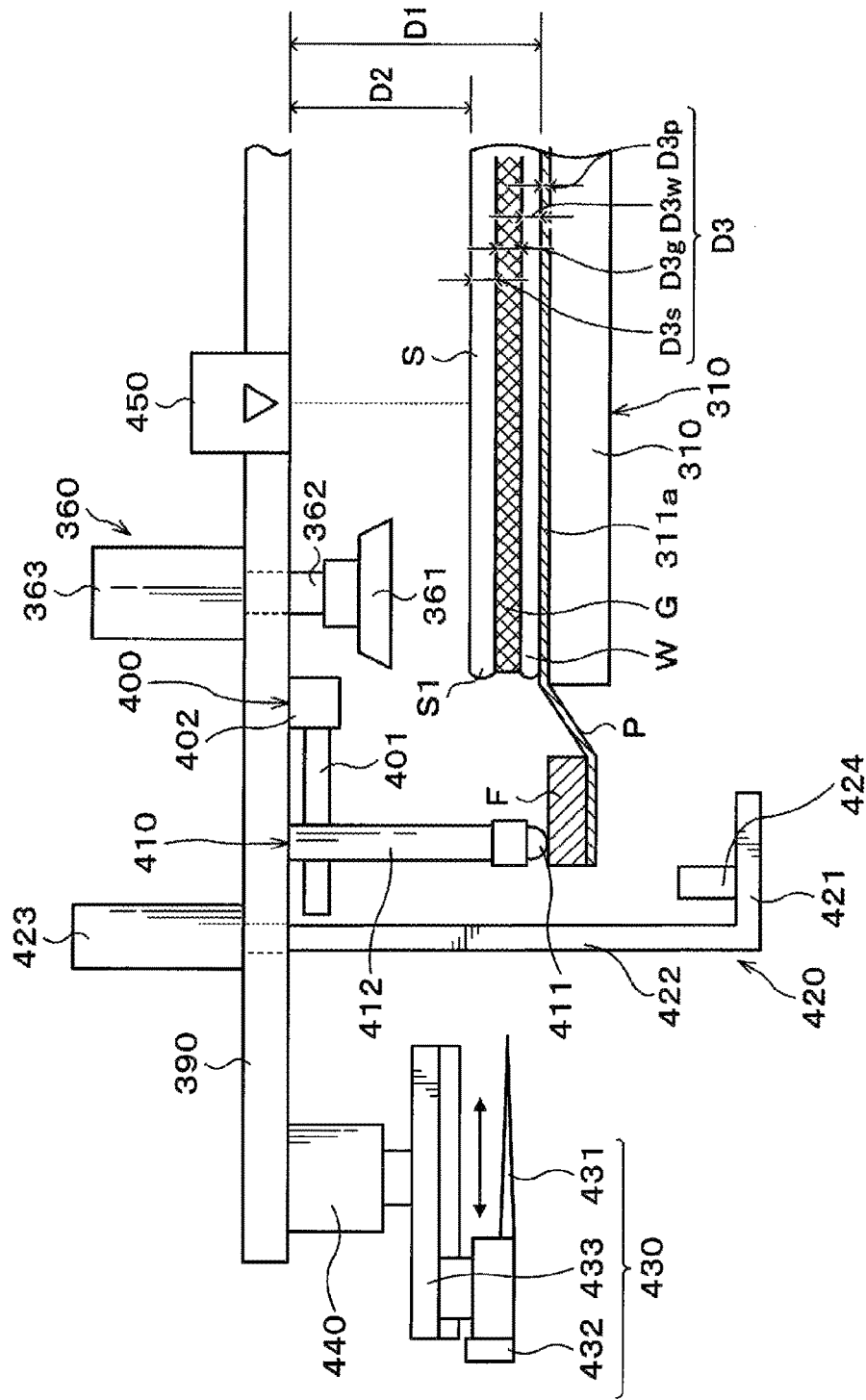
FIG. 6 is a partially-enlarged explanatory view of the configuration of the delamination device.

As shown in FIG. 6, each of the position adjusting units 400 includes an arm portion 401 and a rotational movement mechanism 402 configured to rotate the arm portion 401. The arm portion 401 is an elongated member. The base end portion of the arm portion 401 is rotatably connected to the rotational movement mechanism 402. The longitudinal length of the arm portion 401 is set at such a value that, when the arm portion 401 is rotated by the rotational movement mechanism 402 until the tip portion thereof is oriented vertically downward, the tip portion makes contact with the side surface of the laminated substrate T, more specifically the side surface of the support substrate S, and at such a value that the arm portion 401 does not interfere with the dicing frame F during the rotational movement. In this way, the arm portion 401 is configured to move toward and away from the side surface of the laminated substrate T. The arm portion 401 is made of various resins, e.g., polyoxymethylene (POM), celazole (PBI), etc.

The rotational movement mechanism 402 is fixed to, e.g., the lower portion of the upper base unit 390, to rotationally move the arm portion 401 about the base end portion thereof. At this time, as mentioned above, the arm portion 401 during the rotational movement does not interfere with the dicing frame F. If the arm portion 401 of each of the position adjusting units 400 is rotationally moved by the rotational movement mechanism 402, the tip portion of the arm portion 401 makes contact with the side surface of the laminated substrate T (or the side surface of the support substrate S). Thus, the laminated substrate T is adjusted in position to a predetermined position. By providing the position adjusting units 400 as described above, even if the laminated substrate T is held in the first holding unit 310 at a position shifted from a predetermined position, it is possible to move the laminated substrate T to a right position on the first holding unit 310, e.g., a position coinciding with the suction surface 311a. Thus, it becomes possible to correct the position of the laminated substrate T.

As shown in FIG. 5, the push-down units 410 configured to push the dicing frame F vertically downward are disposed outside the second holding unit 350. The push-down units 410 are installed at three points in the outer periphery of the dicing frame F. The push-down units 410 are disposed at a regular interval about the central portion of the dicing frame F. While the push-down units 410 are installed at three points in the above description, this is illustrative and not limitative. As an example, the push-down units 410 may be installed at four or more points.

As shown in FIG. 6, each of the push-down units 410 includes a ball bearing 411 and a support member 412. The ball bearing 411 is supported at the tip portion of the support member 412. The base end portion of the support member 412 is fixed to the lower portion of the upper base unit 390.

The ball bearing 411 makes contact with the surface of the dicing frame F and pushes the dicing frame F vertically downward with respect to the laminated substrate T. The dicing frame F is rotatably pushed downward by the ball bearing 411. Consequently, a space into which the below-described delamination inducing unit 430 can intrude is formed at the side surface of the laminated substrate T. As a result, a sharp member (to be described later) of the delamination inducing unit 430 can be easily caused to come close to and make contact with the side surface of the laminated substrate T, more specifically the side surface of the support substrate S near the bonding agent G.

As shown in FIG. 5, the delivery units 420 configured to deliver the laminated substrate T to the first holding unit 310 are disposed outside the second holding unit 350, more specifically outside the push-down units 410. The delivery units 420 are respectively installed at positions corresponding to two points at the left and right sides of the dicing frame F. While the delivery units 420 are installed at two points in the above description, this is illustrative and not limitative. As an example, the delivery units 420 may be installed at three or more points.

As shown in FIG. 6, each of the delivery units 420 includes a horizontal holding member 421, a vertical support member 422 and a movement mechanism 423. A guide portion 424 is installed in the horizontal holding member 421 of each of the delivery units 420.

The horizontal holding member 421 extends in the horizontal direction. The guide portion 424 is installed on the horizontal holding member 421. The guide portion 424 performs position adjustment such that the laminated substrate T held on the horizontal holding member 421 is located at a predetermined position with respect to the first holding unit 310. That is to say, the guide portion 424 performs position adjustment of the laminated substrate T before the position of the laminated substrate T is adjusted by the position adjusting units 400.

The vertical support member 422 extends in the vertical direction and supports the horizontal holding member 421. The base end portion of the vertical support member 422 is supported by the movement mechanism 423. The movement mechanism 423 is fixed to the upper portion of the upper base unit 390 and is configured to move the vertical support member 422 in the vertical direction.

Each of the delivery units 420 causes the movement mechanism 423 to move the vertical support member 422, the horizontal holding member 421 and the guide portion 424 along the vertical direction. Thus, the horizontal holding member 421 which has received the laminated substrate T from the first transfer device 131 is moved in the vertical direction to deliver the laminated substrate T to the first holding unit 310.

As shown in FIG. 5, the delamination inducing unit 430 is disposed outside the second holding unit 350, more specifically outside one of the delivery units 420. The delamination inducing unit 430 is configured to form a delamination trigger part, in which the support substrate S begins to be delaminated from the target substrate W, on the side surface of the one end portion S1 of the laminated substrate T.

As shown in FIG. 6, the delamination inducing unit 430 includes a sharp member 431, a load cell 432 and a movement mechanism 433. The sharp member 431 is, e.g., an edge tool. The sharp member 431 is supported by the movement mechanism 433 such that the tip of the sharp member 431 protrudes toward the laminated substrate T. For the sharp member 431, it may be possible to use, e.g., a razor blade, a roller blade or an ultrasonic cutter. The load cell 432 is installed in the end portion of the sharp member 431 to detect a force (or a load) applied to the sharp member 431.

The movement mechanism 433 is configured to move the sharp member 431 along a rail extending in the Y-axis direction. The delamination inducing unit 430 moves the sharp member 431 using the movement mechanism 433, thereby bringing the sharp member 431 into contact with the side surface of the support substrate S near the bonding agent G. Consequently, the delamination inducing unit 430 forms a delamination trigger part (hereinafter referred to as a "delamination start part"), in which the support substrate S begins to be delaminated from the target substrate W, on the side surface of the one end portion S1 of the laminated substrate T.

The movement mechanism 433 is supported by the movement adjusting unit 440 from above. The movement adjusting unit 440 is fixed to, e.g., the lower portion of the upper base unit 390, and is configured to move the movement mechanism 433 along the vertical direction. Thus, the movement adjusting unit 440 can adjust the height position of the sharp member 431, namely the contact position at which the sharp member 431 makes contact with the side surface of the laminated substrate T.

Figure 7:
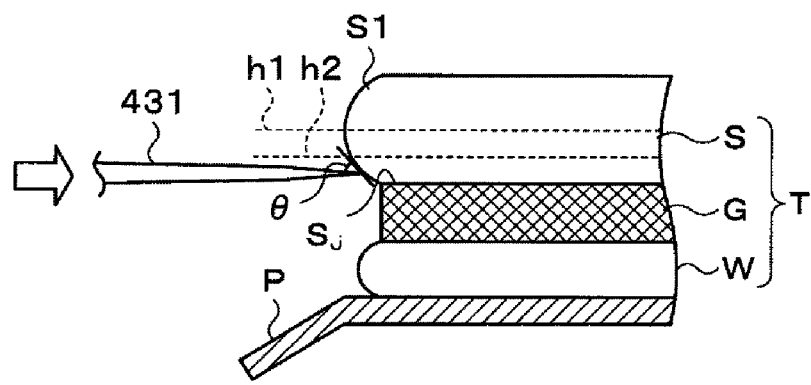
FIGS. 7 to 11 are operation explaining views of a delamination inducing process.
Figure 8:
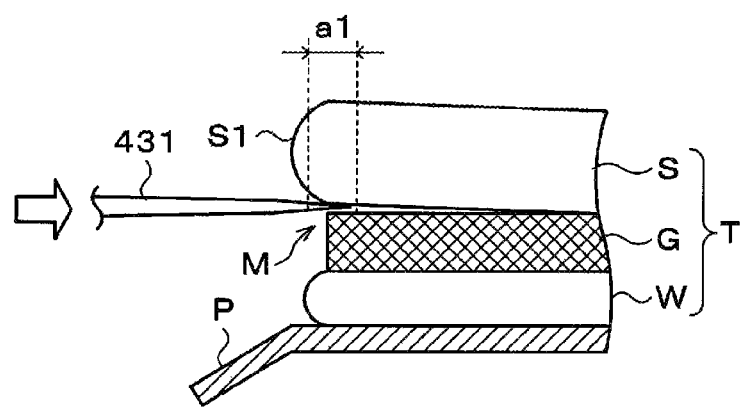
Figure 9:
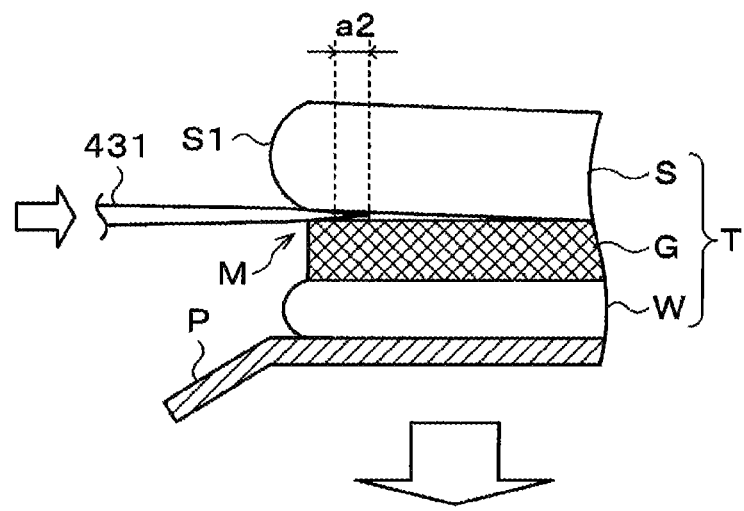

Now, the content of a delamination inducing process performed by the delamination inducing unit 430 will be described in detail with reference to FIGS. 7 to 9. FIGS. 7 to 9 are operation explaining views of the delamination inducing process.

The delamination inducing process is performed after the target substrate W of the laminated substrate T is held by the first holding unit 310 with the dicing frame F pushed down by the push-down units 410 and before the support substrate S is held by the second holding unit 350. That is to say, the delamination inducing process is performed while the support substrate S stays free. The delamination inducing unit 430 performs the delamination inducing process shown in FIGS. 7 to 9, under the control of the control device 30.

In the delamination inducing unit 430, the height position of the sharp member 431 is adjusted using the movement adjusting unit 440. Thereafter, the sharp member 431 is moved toward the side surface of the laminated substrate T using the movement mechanism 433. Specifically, as shown in FIG. 7, the sharp member 431 is substantially horizontally moved toward the side surface of the one end portion S1 of the laminated substrate T, namely the side surface of the support substrate S near the bonding agent G.

The expression "the side surface of the support substrate S near the bonding agent G" refers to the side surface of the support substrate S existing closer to the bonding surface Sj than the position h1 corresponding to one half of the thickness of the support substrate S. That is to say, the side surface of the support substrate S is formed into a substantially arc-like shape. "The side surface of the support substrate S near the bonding agent G" makes an angle θ of 0 degree or more and less than 90 degrees with respect to the sharp member 431, when the angle between the sharp member 431 and the bonding surface Sj is assumed to be 0 degree.

First, the sharp member 431 is moved forward to a predetermined position (preliminary forward movement). Thereafter, the sharp member 431 is further moved forward to bring the sharp member 431 into contact with the side surface of the support substrate S near the bonding agent G.

At this time, the contact of the sharp member 431 with the support substrate S is detected using one or both of the load cell 432 and the movement mechanism 433. That is to say, the contact of the sharp member 431 with the support substrate S may be detected by measuring the force applied to the sharp member 431 through the use of the load cell 432 and detecting the change of the force. Moreover, the contact of the sharp member 431 with the support substrate S may be detected by measuring the torque of a motor installed within the movement mechanism 433 and detecting the change of the torque. In addition, when the change of the force measured by the load cell 432 is detected and when the change of the torque of the motor of the movement mechanism 433 is detected, it may be possible to detect the contact of the sharp member 431 with the support substrate S.

It is sometimes the case that the first holding unit 310 is disposed with a slight shift in the horizontal direction due to various causes, e.g., an installation error, etc. In this case, when a delamination start part is formed in the laminated substrate T by the delamination inducing unit 430, the sharp member 431 may enter the side surface of the laminated substrate T beyond a preset range. If such is the case, there is a possibility that an electronic circuit formed on the bonding surface Wj of the target substrate W is damaged by the sharp member 431.

In the present embodiment, even when one of the load cell 432 and the movement mechanism 433 is used as mentioned above, it is possible to detect the contact of the sharp member 431 with the support substrate S. Thus, the sharp member 431 can be entered into the side surface of the laminated substrate T by a suitable distance. This makes it possible to prevent an electronic circuit from being damaged.

If the sharp member 431 makes contact with the side surface of the support substrate S near the bonding agent G, an upwardly-acting force is applied to the support substrate S because the side surface of the support substrate S has a substantially arc-like shape.

Subsequently, as shown in FIG. 8, the sharp member 431 is further moved forward. Thus, the support substrate S is pushed upward along a curved surface of the side surface. As a result, a portion of the support substrate S is delaminated from the bonding agent G, whereby a delamination start part M is formed.

Since the support substrate S is not held by the second holding unit 350 and is kept in a free state, the upward movement of the support substrate S is not limited. In this process, the forward movement distance a1 of the sharp member 431 is, e.g., about 1 mm. The distance a1 is set depending on, e.g., the kind or thickness of the bonding agent G, and is previously stored in the control device 30.

In the delamination device 141, it may be possible to install a checking unit configured to check the delamination state of the support substrate S delaminated by the aforementioned process, specifically a checking unit (not shown) configured to check the formation of the delamination start part M. More specifically, the checking unit may be, e.g., an IR (Infrared) camera installed above the support substrate S.

Specifically, the reflectance of an infrared ray is changed in the region of the support substrate S delaminated from the target substrate W and in the region of the support substrate S not delaminated from the target substrate W. Thus, the support substrate S is first imaged by the IR camera, thereby obtaining image data which show a reflectance difference of the infrared ray at the support substrate S. The image data are transmitted to the control device 30. Based on the image data, the control device 30 can detect the part of the support substrate S delaminated from the target substrate W, namely the delamination start part M.

If the delamination start part M is detected by the control device 30, the next process to be described later proceeds. On the other hand, if the delamination start part M is not detected by the control device 30, the delamination start part M may be formed by, for example, causing the sharp member 431 to further move forward or by, for example, causing the sharp member 431 to move backward away from the support substrate S and performing again the operations shown in FIGS. 7 and 8. In this way, the checking unit configured to check the delamination state of the support substrate S is installed and the delamination device 141 is operated depending on the delamination state. Thus, it becomes possible to reliably form the delamination start part M.

If the delamination start part M is formed, as shown in FIG. 9, the delamination device 141 causes the sharp member 431 to further move forward while lowering the first holding unit 310 through the use of the elevator mechanism 340. Thus, a downwardly-acting force is applied to the target substrate W and the bonding agent G. An upwardly-acting force is applied to the support substrate S supported by the sharp member 431. Consequently, the delamination start part M is enlarged.

In this process, the forward movement distance a2 of the sharp member 431 is, e.g., about 1 mm. The distance a2 is set depending on, e.g., the kind or thickness of the bonding agent G, and is previously stored in the control device 30.

The distance a1+a2 at which the sharp member 431 moves forward after making contact with the support substrate S is set to fall within at least a range in which the tip of the sharp member 431 does not reach an electronic circuit formed on the bonding surface Wj of the target substrate W and does not cause damage to the electronic circuit.

In this way, the delamination device 141 brings the sharp member 431 into contact with the side surface of the support substrate S near the bonding agent G, whereby the delamination start part M at which the support substrate S begins to be delaminated from the target substrate W can be formed on the side surface of the laminated substrate T.

By bringing the sharp member 431 into contact with the side surface of the support substrate S near the bonding agent G, it is possible to apply a force acting in a direction in which the support substrate S is delaminated from the target substrate W (namely an upwardly-acting force) to the support substrate S. Since the region close to the outermost edge portion of the support substrate S is lifted up, a force acting in a direction in which the support substrate S is delaminated from the target substrate W can be efficiently applied to the support substrate S.

As shown in FIG. 7, in some embodiments, "the side surface of the support substrate S near the bonding agent G" is the side surface which extends from the bonding surface Sj of the support substrate S to the position h2 corresponding to one quarter of the thickness of the support substrate S, namely the side surface which makes an angle θ of 0 degree or more and 45 degrees or less with respect to the sharp member 431. This is because the lifting force can be made larger as the angle θ between the side surface and the sharp member 431 becomes smaller.

In case where the bonding force between the support substrate S and the bonding agent G is relatively weak, as shown in FIG. 7, the delamination start part M can be formed by merely bringing the sharp member 431 into contact with the side surface of the support substrate S near the bonding agent G. In this case, the operations shown in FIGS. 8 and 9 may be omitted.

Figure 10:
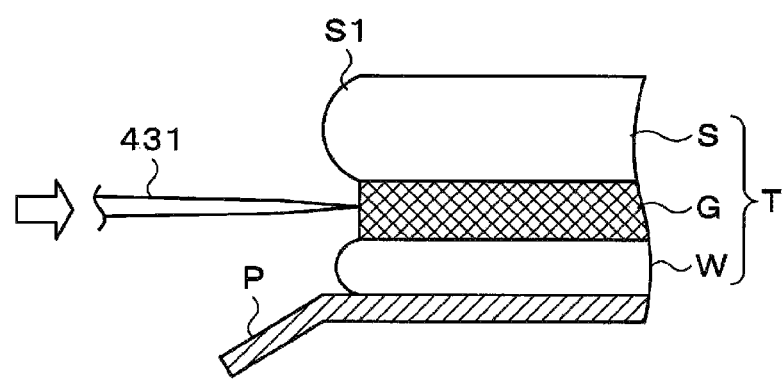

In case where the bonding force between the support substrate S and the bonding agent G is relatively strong, it is sometimes the case that bonding force between the support substrate S and the bonding agent G is stronger than the upwardly-acting force applied to the support substrate S when the sharp member 431 is brought into contact with the support substrate S. In this case, if the sharp member 431 is brought into contact with the side surface of the support substrate S, there may be a case where the laminated substrate T is peeled off from the dicing tape P. Under this circumstance, as shown in FIG. 10, a delamination start part M may be formed by bringing the sharp member 431 into contact with the bonding agent G. Then, as shown in FIG. 11, the sharp member 431 is caused to move forward, thereby forming a delamination start part M on the side surface of the bonding agent G.

There may be a case where a release film is disposed between the support substrate S and the bonding agent G in order to facilitate delamination of the support substrate S from the bonding agent G. Moreover, there may be a case where the release film is extruded from between the support substrate S and the target substrate W to cover the side surface of the bonding agent G. In this case, even if one attempts to delaminate the support substrate S from the target substrate W, the release film is pulled in conjunction with the movement of the support substrate S and the target substrate W is also pulled. This makes it impossible to appropriately delaminate the support substrate S from the target substrate W. Under this circumstance, if the sharp member 431 is brought into contact with the bonding agent G as shown in FIGS. 10 and 11, a delamination start part M is formed even in the release film. It is therefore possible to appropriately delaminate the support substrate S from the target substrate W.

Figure 11:
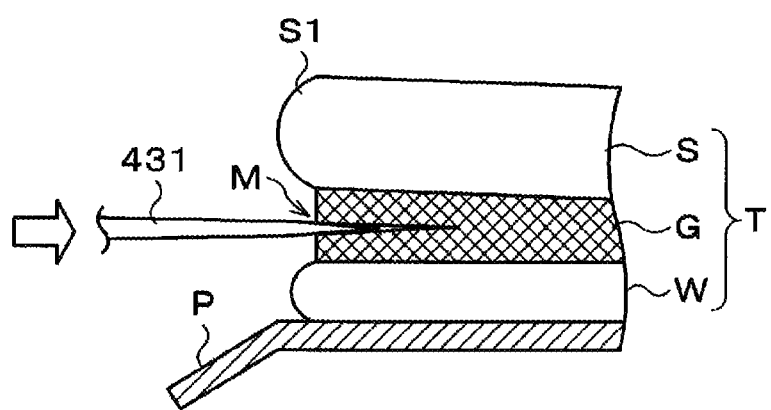

For example, the delamination device 141 may rotate the rotary mechanism 330 from the state shown in FIG. 9 or 11, thereby rotating the first holding unit 310, e.g., 360 degrees, about a vertical axis. Since the push-down units 410 are provided with the ball bearings 411, the first holding unit 310 can be rotated in a state in which the dicing frame F is pushed down by the push-down units 410. As a result, a delamination start part M is formed over the entire circumference of the bonding surface Sj of the support substrate S or over the entire circumference of the bonding agent G. This makes it easy to delaminate the support substrate S from the target substrate W.

As a result of studies conducted by the present inventors, it was found that a crack is sometimes generated in the outer periphery of the delaminated target substrate W. One cause of generation of the crack may be that the laminated substrate T is not appropriately delaminated in the outer periphery thereof during the delamination process of the laminated substrate T. Particularly, if the release film is disposed between the support substrate S and the bonding agent G as set forth above, the release film and the target substrate W are pulled in conjunction with the movement of the support substrate S. Thus, a crack is easily generated in the outer periphery of the target substrate W. In the present embodiment, a delamination start part M can be formed over the entire circumference of the support substrate S or the bonding agent G by rotating the first holding unit 310. Therefore, the target substrate W is not pulled in conjunction with the movement of the support substrate S. This makes it possible to suppress generation of a crack in the outer periphery of the delaminated target substrate W. Moreover, even if the release film is disposed, the release film and the target substrate W are not pulled in conduction with the movement of the support substrate S. This makes it possible to more effectively suppress generation of a crack in the outer periphery of the delaminated target substrate W.

Next, a description will be made on the measuring unit 450 that measures the height position of the sharp member 431. The measuring unit 450 is, e.g., a laser displacement meter, and is installed in the upper base unit 390 as shown in FIG. 6. The measuring unit 450 is configured to measure a distance from a predetermined measurement reference position to a holding surface of the first holding unit 310, or a distance to an object existing between the measurement reference position and the holding surface of the first holding unit 310.

The measurement result obtained by the measuring unit 450 is transmitted to the control device 30. The control device 30 is configured to store, in a memory unit (not shown), the information on the thickness of the laminated substrate T previously acquired by an external device (hereinafter referred to as "previous thickness information"). The previous thickness information includes a thickness of the laminated substrate T, a thickness of the target substrate W, a thickness of the support substrate S, a thickness of the bonding agent G and a thickness of the dicing tape P.

Based on the measurement result acquired by the measuring unit 450 and the previous thickness information stored in the memory unit, the control device 30 decides the height position of the sharp member 431 so that the sharp member 431 can make contact with the side surface of the support substrate S near the bonding agent G. Then, the control device 30 controls the movement adjusting unit 440 and moves the delamination inducing unit 430 such that the tip of the sharp member 431 is positioned at the height position thus decided.

Now, the content of a position adjusting process of the delamination inducing unit 430 will be described in detail. First, the delamination device 141 measures the distance D1 to the holding surface of the first holding unit 310 using the measuring unit 450. At this time, the laminated substrate T is not carried into the delamination device 141.

The thickness D3 of the laminated substrate T, the thickness D3$w$ of the target substrate W, the thickness D3$g$ of the bonding agent G, the thickness D3$s$ of the support substrate S and the thickness D3$p$ of the dicing tape P shown in FIG. 6 are the information stored in the memory unit of the control device 30 as the previous thickness information.

Subsequently, the delamination device 141 sucks and holds the laminated substrate T using the first holding unit 310 and, then, measures the distance D2 to the upper surface of the laminated substrate T sucked and held by the first holding unit 310, namely the non-bonding surface Sn of the support substrate S. The measurement result is transmitted to the control device 30. The control device 30 determines whether a difference between the thickness D1−D2 of the laminated substrate T calculated from the measurement results of the measuring unit 450 and the thickness D3 of the laminated substrate T included in the previous thickness information falls within a predetermined range.

If the difference between the thickness D1−D2 of the laminated substrate T calculated from the measurement results of the measuring unit 450 and the thickness D3 of the laminated substrate T included in the previous thickness information falls outside the predetermined range, there is a possibility that the laminated substrate T different from the laminated substrate T to be originally carried in may be erroneously carried in. In this case, it is impossible to appropriately bring the sharp member 431 into contact with the side surface of the support substrate S near the bonding agent G. In some cases, it is concerned that the sharp member 431 may make contact with the target substrate W, thereby causing damage to the target substrate W.

Thus, if the difference between the thickness of the laminated substrate T calculated from the measurement results of the measuring unit 450 and the thickness of the laminated substrate T included in the previous thickness information falls outside the predetermined range, the delamination device 141 stops the subsequent processes.

On the other hand, if the difference between the thickness of the laminated substrate T calculated from the measurement results of the measuring unit 450 and the thickness of the laminated substrate T included in the previous thickness information falls within the predetermined range, the control device 30 calculates a range of the side surface of the support substrate S near the bonding agent G, namely a height range from the position corresponding to one half of the thickness of the support substrate S to the bonding surface Sj of the support substrate S, based on the previous thickness information. Specifically, the range of the side surface of the support substrate S near the bonding agent G is from D2+D3$s$/2 to D2+D3$s$. The control device 30 decides the height position of the sharp member 431 so as to fall within this height range.

If a cut making position of the delamination inducing unit 430 is decided by the control device 30, the delamination device 141 causes the movement adjusting unit 440 to move the delamination inducing unit 430 under the control of the control device 30, thereby adjusting the height position of the sharp member 431.

As described above, the delamination device 141 includes the measuring unit 450 and the movement adjusting unit 440. The measuring unit 450 is configured to measure a distance from a predetermined measurement reference position to a holding surface of the first holding unit 310, or a distance to an object existing between the measurement reference position and the holding surface of the first holding unit 310. The movement adjusting unit 440 is configured to adjust the contact position of the sharp member 431 with the support substrate S based on the measurement results of the measuring unit 450 and the information on the thickness of the laminated substrate T acquired in advance. This makes it possible to accurately bring the sharp member 431 into contact with the side surface of the support substrate S near the bonding agent G.

As shown in FIG. 5, the ionizer 460 is installed in the ceiling portion of the processing container 300. The ionizer 460 is configured to eliminate static electricity generated when delaminating the laminated substrate T. This makes it possible to appropriately perform the delamination process of the laminated substrate T. It is also possible to prevent an electronic circuit on the target substrate W from being damaged.

3. Operation of Delamination Device

Figure 12:
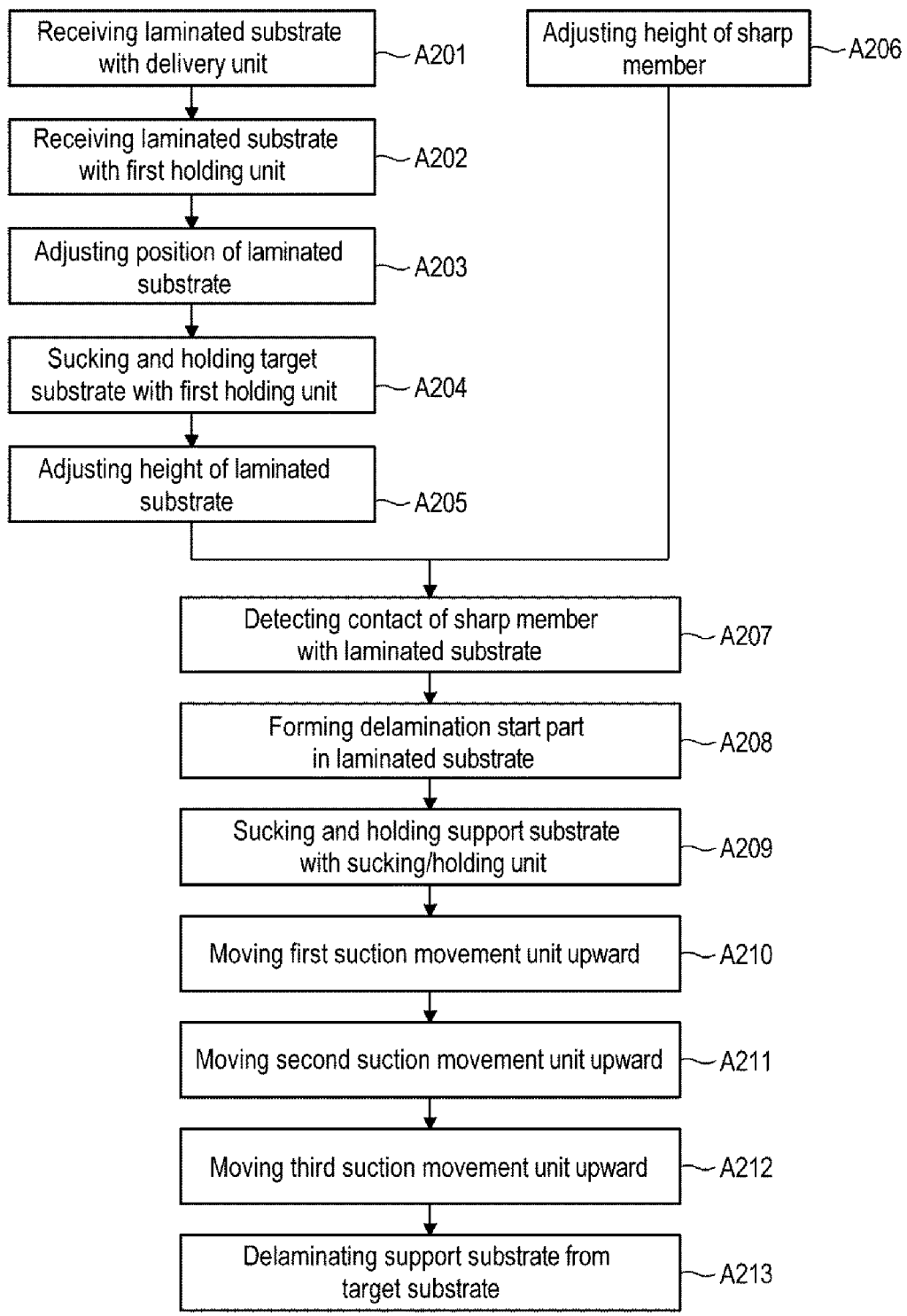
FIG. 12 is a flowchart showing major steps of a delamination process performed in the delamination device.

Next, a description will be made on a delamination process of the target substrate W and the support substrate S performed by the delamination device 141. FIG. 12 is a flowchart showing an example of major steps of the delamination process. FIGS. 13 to 21 are explanatory views of the delamination process. The delamination device 141 performs the respective process sequences shown in FIG. 12, under the control of the control device 30.

Figure 13:
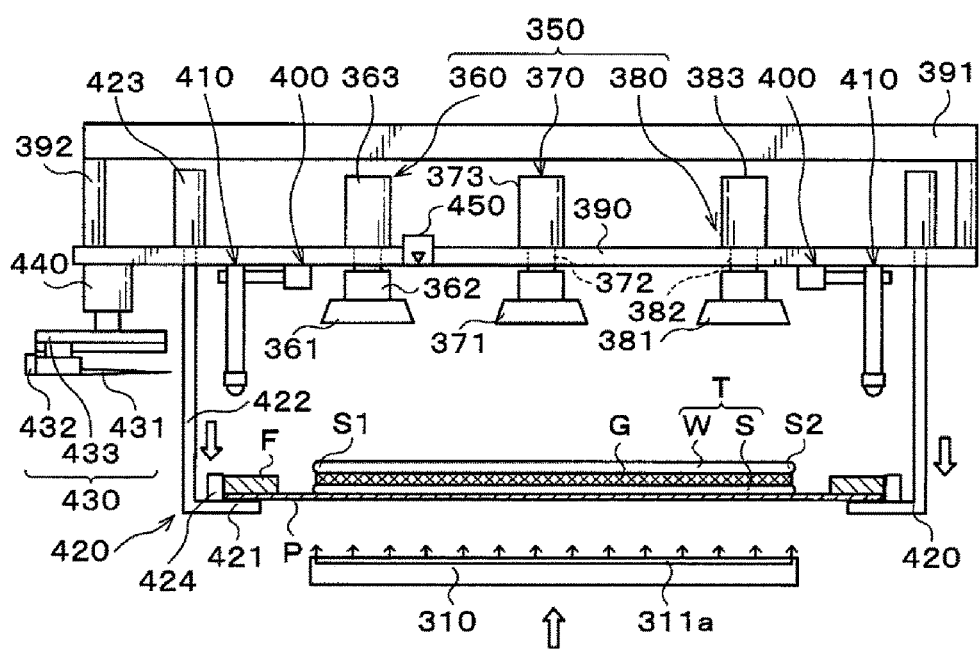
FIGS. 13 to 21 are explanatory views of a delamination operation performed by the delamination device.

First, the laminated substrate T carried into the delamination device 141 by the first transfer device 131 is delivered to the delivery units 420 kept on standby as shown in FIG. 13 (Step A201 in FIG. 12). The laminated substrate T delivered to the delivery units 420 is adjusted in position by the guide portions 424 such that the laminated substrate T is located at a predetermined position with respect to the first holding unit 310. At this time, the first holding unit 310 is positioned below the delivery units 420. In the first holding unit 310, a gas supplied from the gas supply source 316 to the suction surface 311a is ejected in order to suppress clogging of a plurality of holes of the suction surface 311a.

Figure 14:
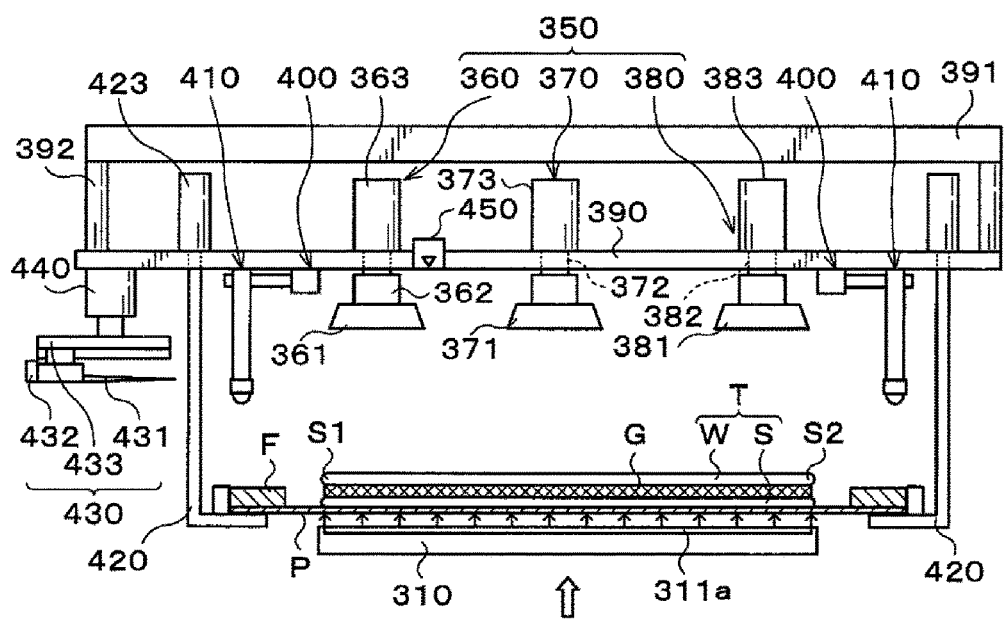

Thereafter, as shown in FIG. 14, the first holding unit 310 is moved upward and the laminated substrate T is delivered from the delivery units 420 to the first holding unit 310 (Step A202 in FIG. 12). At this time, the gas is ejected from the suction surface 311a of the first holding unit 310. The laminated substrate T is held on the first holding unit 310 in a state in which the laminated substrate T floats upward from the first holding unit 310. The gap between the laminated substrate T and the suction surface 311a is small and the laminated substrate T is appropriately held on the first holding unit 310.

Figure 15:
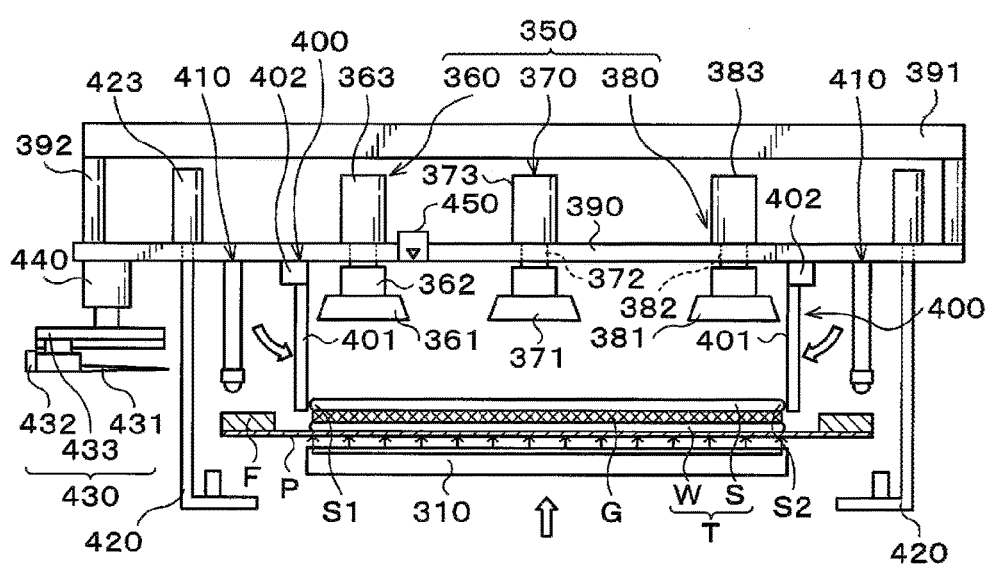

Thereafter, as shown in FIG. 15, the first holding unit 310 is further moved upward and the laminated substrate T held on the first holding unit 310 is adjusted in position to a predetermined position by the position adjusting units 400 (Step A203 in FIG. 12). Specifically, the arm portions 401 are rotationally moved by the rotational movement mechanisms 402. At this time, the longitudinal length of the arm portions 401 is appropriately set and, therefore, the rotationally moving arm portions 401 do not interfere with the dicing frame F. If the arm portions 401 of the position adjusting units 400 are rotationally moved by the rotational movement mechanisms 402, the tip portions of the arm portions 401 make contact with the side surface of the support substrate S. Thus, the laminated substrate T is adjusted in position to a predetermined position. Since the arm portions 401 make contact with the side surface of the support substrate S, the target substrate W as a product is not damaged.

At Step A203, just like Step A202, the gas is ejected from the suction surface 311a of the first holding unit 310 such that the laminated substrate T floats upward from the first holding unit 310. In this case, the laminated substrate T is easily movable. Thus, the position adjustment of the laminated substrate T can be smoothly performed by the position adjusting units 400.

Thereafter, the valve 314 is switched to stop the supply of the gas from the gas supply source 316 to the first holding unit 310. The suction of the suction surface 311a using the intake device 315 is started. Then, as shown in FIG. 16, the first holding unit 310 sucks and holds the target substrate W through the dicing tape P (Step A204 in FIG. 12).

Figure 16:
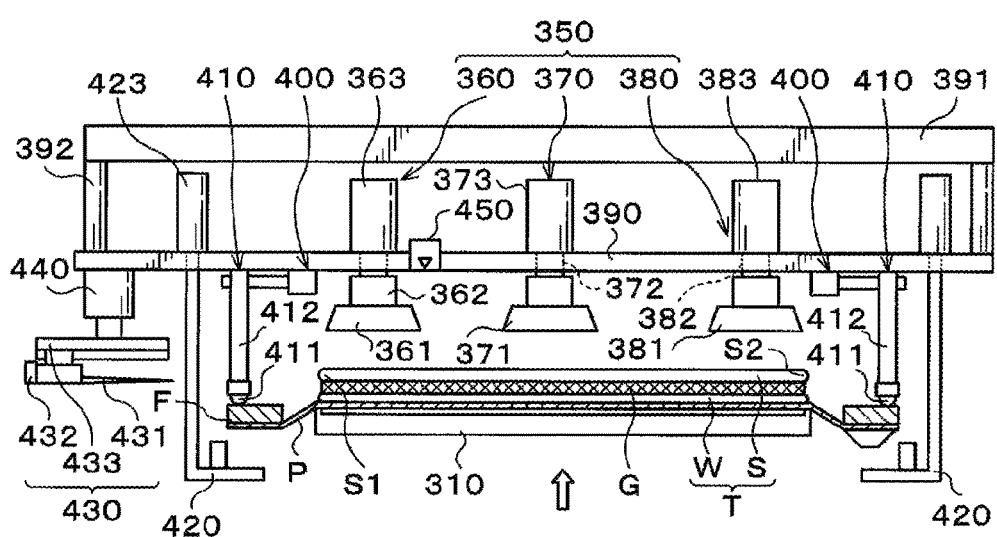

Thereafter, as shown in FIG. 16, the first holding unit 310 is further moved upward, whereby the laminated substrate T held on the first holding unit 310 is disposed at a predetermined position where a delamination process is performed (Step A205 in FIG. 12). At this time, the dicing frame F is pushed downward in the vertical direction with respect to the laminated substrate T by the push-down units 410. Thus, a space into which the delamination inducing unit 430 can intrude is formed at the side surface of the laminated substrate T.

The height of the sharp member 431 is adjusted while performing Steps A201 to A205 (Step A206 in FIG. 12). Specifically, after measuring unit 450 measures the height position of the sharp member 431, the delamination inducing unit 430 is moved to a predetermined height position by the movement adjusting unit 440.

Thereafter, the sharp member 431 of the delamination inducing unit 430 is moved toward the laminated substrate T and is brought into contact with the support substrate S. At this time, as described above with reference to FIG. 7, the contact of the sharp member 431 with the support substrate S is detected using one or both of the load cell 432 and the movement mechanism 433 (Step A207 in FIG. 12).

Figure 17:
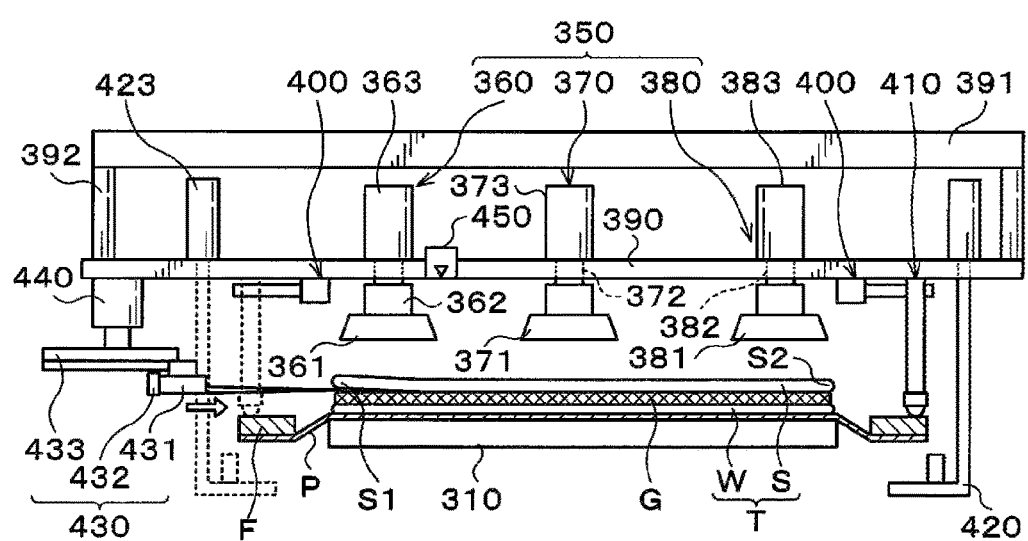

Thereafter, as shown in FIG. 17, the delamination inducing process described above with reference to FIGS. 7 to 9 is performed while further causing the sharp member 431 to move forward (Step A208 in FIG. 12). Thus, a delamination start part M is formed on the side surface of the one end portion S1 of the laminated substrate T.

Figure 18:
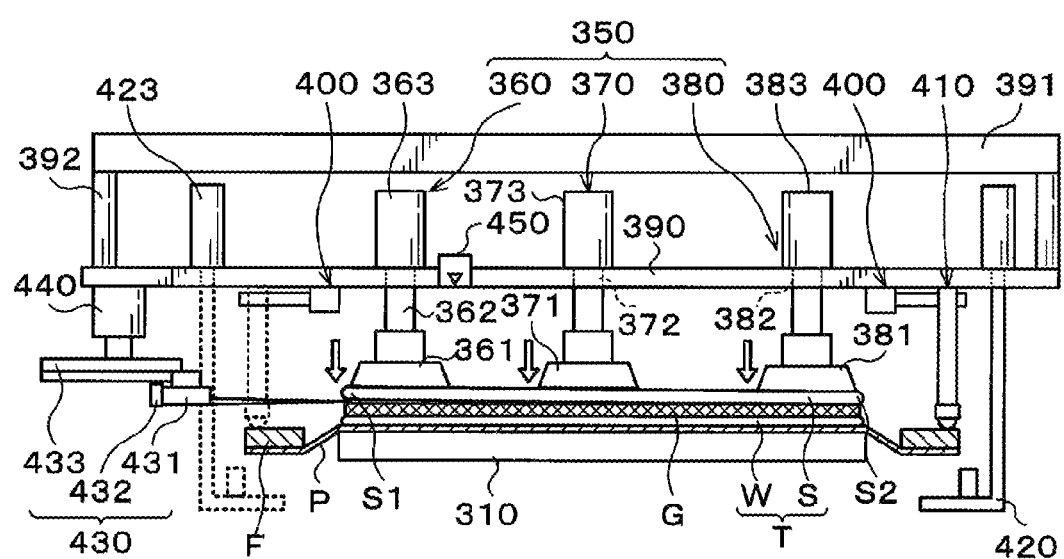

Thereafter, as shown in FIG. 18, the suction pads 361, 371 and 381 of the first to third suction movement units 360, 370 and 380 are moved down and brought into contact with the support substrate S. Then, the non-bonding surface $S_n$ of the support substrate S is sucked and held by the first to third suction movement units 360, 370 and 380 (Step A209 in FIG. 12).

Figure 19:
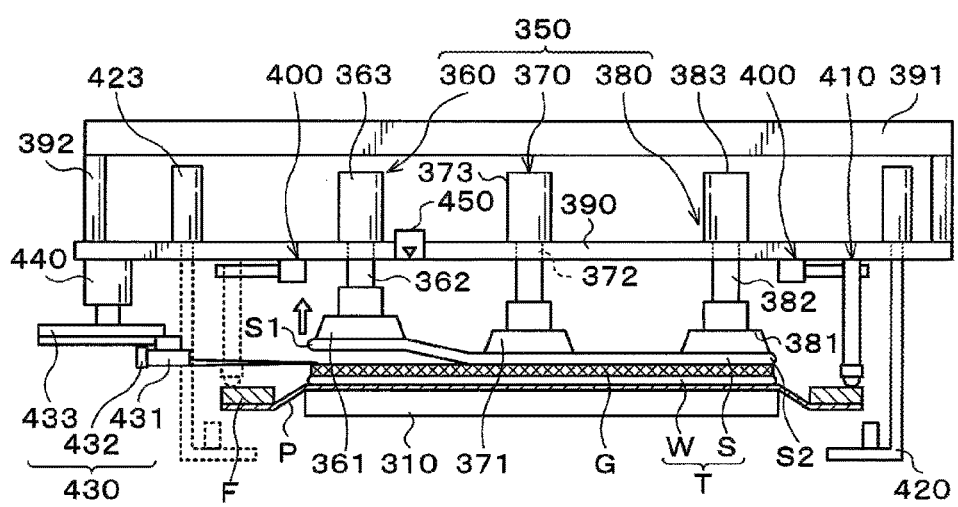

Subsequently, as shown in FIG. 19, the suction pad 361 of the first suction movement unit 360 is moved up (Step A210 in FIG. 12). That is to say, the peripheral edge portion of the one end portion S1 of the support substrate S corresponding to the delamination start part M is pulled. Thus, the support substrate S begins to be continuously delaminated from the target substrate W such that the delamination proceeds from the peripheral edge portion of the support substrate S toward the central portion thereof.

Figure 22:
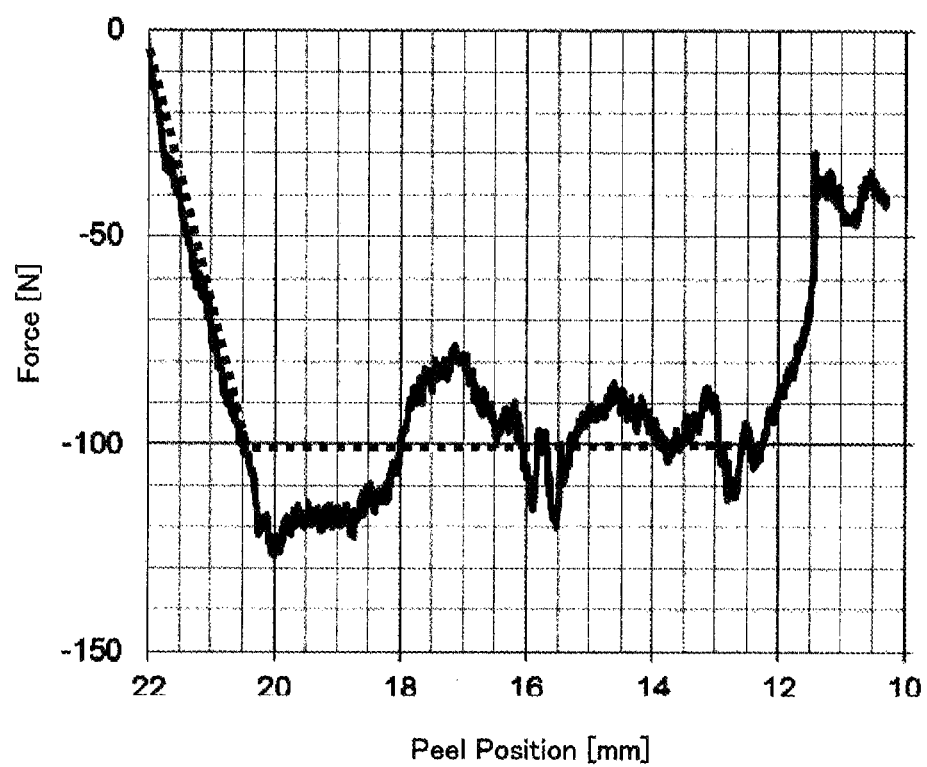
FIG. 22 is a graph showing a force applied to a suction pad of a first suction movement unit.

As a result of studies conducted by the present inventors, it was found that a crack is generated in the outer periphery of the delaminated target substrate W. The force applied to the suction pad 361 was investigated in order to find a cause of generation of the crack. The horizontal axis in FIG. 22 indicates the vertical distance from the fixing member 391 to the suction pad 361. The vertical axis indicates the force applied to the suction pad 361. In FIG. 22, the solid line indicates a case of the related art in which delamination is performed by keeping the moving speed of the suction pad 361 constant. The dot line indicates a case of the present embodiment in which delamination is performed by keeping constant the force applied to the suction pad 361 as described later.

Referring to FIG. 22, it can be noted that, when the suction pad 361 is positioned in a vertical distance range of from 22 mm to 20 mm, the support substrate S is not delaminated from the target substrate W and further that, when the suction pad 361 is positioned more vertically upward than a vertical distance of 20 mm, the delamination of the support substrate S from the target substrate W is started. It can be further noted that, as the suction pad 361 is moved upward after the start of delamination, the force applied to the suction pad 361 varies little by little (see the solid line in FIG. 22). It is presumed that the generation of the crack in the outer periphery of the delaminated target substrate W is affected by the variation of the force.

Accordingly, at Step A210, the force applied to the suction pad 361 is kept constant by controlling the movement mechanism 363 of the first suction movement unit 360 (see the dot line in FIG. 22). By doing so, it is possible to keep constant the force which is applied when pulling the support substrate S with the first suction movement unit 360. This makes it possible to appropriately delaminate the support substrate S from the target substrate W. As a result, it is possible to suppress generation of a crack in the outer periphery of the delaminated target substrate W.

Typically, the load applied to the suction pad 361 becomes smaller as the delamination proceeds. That is to say, the support substrate S is easily delaminated as the delamination proceeds. For that reason, if the force applied to the suction pad 361 is kept constant as mentioned above, the moving speed of the suction pad 361 grows higher along with the movement of the suction pad 361. This makes it possible to increase the delamination speed at which the support substrate S is delaminated from the target substrate W.

Figure 20:
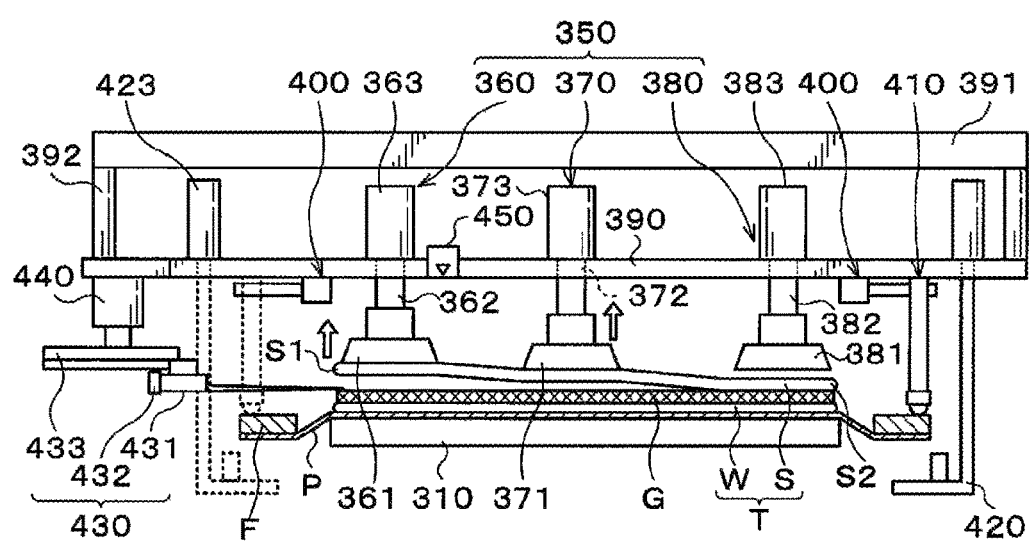

Thereafter, as shown in FIG. 20, the suction pad 371 of the second suction movement unit 370 is moved upward (Step A211 in FIG. 12). That is to say, while pulling the peripheral edge portion of the one end portion S1 of the support substrate S, the delamination device 141 also pulls the central portion of the support substrate S. Even at Step A211, the force applied to the suction pad 371 may be kept constant by controlling the movement mechanism 373 of the second suction movement unit 370. In this case, it is possible to further stabilize the delamination process and to further increase the delamination speed.

Figure 21:
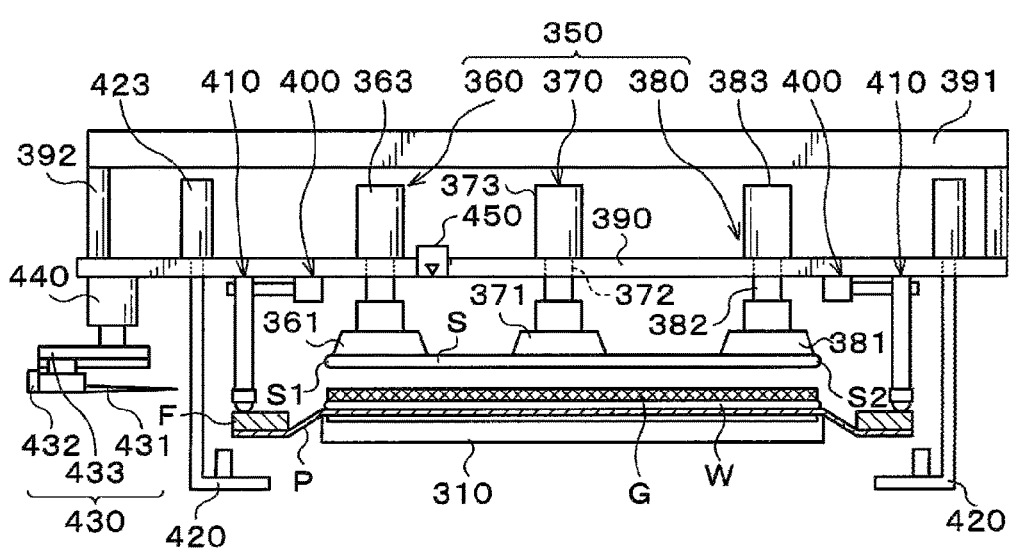

Thereafter, as shown in FIG. 21, the suction pad 381 of the third suction movement unit 380 is moved upward (Step A212 in FIG. 12). That is to say, while pulling the peripheral edge portion of the one end portion S1 of the support substrate S and the central portion of the support substrate S, the delamination device 141 also pulls the peripheral edge portion of the other end S2 of the support substrate S. Thus, the support substrate S is delaminated from the target substrate W (Step A213 in FIG. 12). Even at Step A212, the force applied to the suction pad 381 may be kept constant by controlling the movement mechanism 383 of the third suction movement unit 380. In this case, it is possible to further stabilize the delamination process and to further increase the delamination speed.

Thereafter, the support substrate S is made horizontal by causing only the second and third suction movement units 370 and 380 to move upward or by causing only the first and second suction movement units 360 and 370 to move downward. Then, the sharp member 431 is moved backward. In this way, the delamination device 141 terminates a series of delamination processes for the target substrate W and the support substrate S.

According to the present embodiment, at Step A208, the delamination start part M is formed on the side surface of the laminated substrate T by the delamination inducing unit 430. Thereafter, at Steps A209 to A213, the support substrate S is gradually delaminated from the target substrate W by the first to third suction movement units 360, 370 and 380 such that the delamination proceeds from the one end portion S1 toward the other end portion S2 using the delamination start part M as a starting point. In this case, when the portion of the support substrate S corresponding to the delamination start part M is moved away from the target substrate W at the delamination start time, it is possible to reduce the load applied to the first suction movement unit 360. Since the first to third suction movement units 360, 370 and 380 can pull the support substrate S in such a way that the peripheral edge portion of the one end portion S1 of the support substrate S is rolled up, it is possible to efficiently delaminate the target substrate W and the support substrate S.

The laminated substrate T is disposed at a predetermined height position by performing Steps A201 to A205 prior to Steps A208 to A213. The sharp member 431 is disposed at a predetermined height position by performing Step A206. At Step A207, the contact of the sharp member 431 with the side surface of the support substrate S is detected. Thus, at Step A208, the delamination start part M can be appropriately formed by the sharp member 431. At Steps A209 to A213, it is possible to appropriately delaminate the target substrate W and the support substrate S.

4. Other Embodiments

In the delamination device 141 of the embodiment described above, there may be installed a delamination completion detecting unit which detects that the entire bonding surface Sj of the support substrate S bonded to the target substrate W is completely delaminated from the target substrate W.

Figure 23:
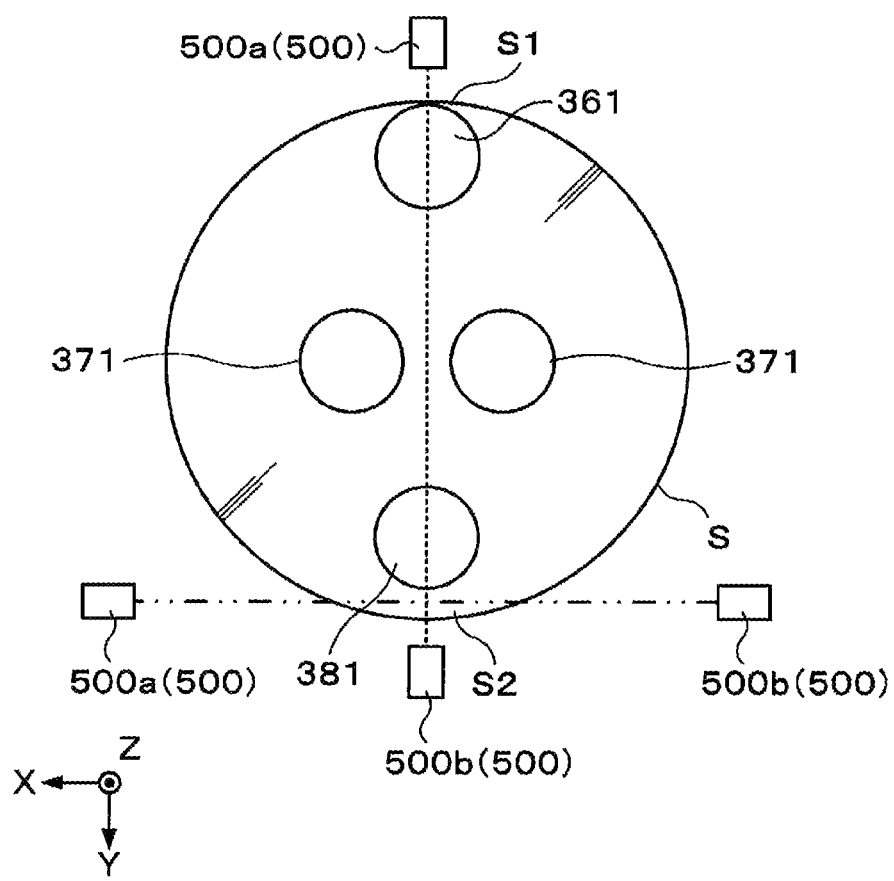
FIG. 23 is a schematic plan view showing a positional relationship between a support substrate, suction pads of first to third suction movement units and a delamination completion detecting unit.

FIG. 23 is a schematic plan view showing a positional relationship between the support substrate S, the suction pad 361 of the first suction movement unit 360, the suction pad 371 of the second suction movement unit 370, the suction pad 381 of the third suction movement unit 380 and the delamination completion detecting unit 500.

The delamination completion detecting unit 500 is, e.g., a photoelectric sensor. Specifically, the delamination completion detecting unit 500 includes a light emitting unit (or a delamination-completion-detecting light emitting unit) 500a which is disposed near the one end portion S1 of the support substrate S and which is configured to emit light toward a bonding portion of the target substrate W and the support substrate S (e.g., the bonding agent G) in a direction parallel to the direction extending from the one end portion S1 to the other end portion S2. The delamination completion detecting unit 500 further includes a light receiving unit (or a delamination-completion-detecting light receiving unit) 500b which is disposed at the opposite side of the laminated substrate T from the light emitting unit 500a, namely near the other end portion S2, and which is configured to receive the light emitted from the light emitting unit 500a. In FIG. 23, the light is indicated by a broken line.

Specifically, if the entire bonding surface Sj of the support substrate S bonded to the target substrate W is completely delaminated from the target substrate W, a gap is formed between the support substrate S and the target substrate W. The light receiving unit 500b is disposed at a position where the light receiving unit 500b can receive the light emitted from the light emitting unit 500a when the gap is formed. Upon receiving the light, the light receiving unit 500b transmits a signal indicative of light reception to the control device 30.

Thus, based on the detection result of the delamination completion detecting unit 500, the control device 30 can determine whether the delamination of the support substrate S is completed. That is to say, if the light is not received by the light receiving unit 500b, the control device 30 determines that the delamination of the support substrate S is not completed. On the other hand, if the light is received by the light receiving unit 500b, the control device 30 determines that the delamination of the support substrate S is completed. The arrangement of the light emitting unit 500a and the light receiving unit 500b is not limited to the illustrated example. For example, the light emitting unit 500a may be disposed near the other end portion S2 and the light receiving unit 500b may be disposed near the one end portion S1.

Owing to the above configuration, the delamination device 141 can easily and simply determine that the delamination of the support substrate S is completed by the delamination process. The configuration of the delamination completion detecting unit 500 is not limited to the configuration described above.

For example, the light emitting unit 500a and the light receiving unit 500b may be disposed such that, as indicated by a double-dot chain line in FIG. 23, the light parallel to the X-axis direction passes through the boding portion of the side of the other end portion S2 of the support substrate S bonded to the target substrate W and finally delaminated from the target substrate W. Even in this configuration, the reception of light in the light receiving unit 500b means that the other end portion S2 of the support substrate S is delaminated from the target substrate W. It is therefore possible for the control device 30 to determine that the delamination of the support substrate S is completed.

In the embodiments described above, there has been described an example where the laminated substrate to be delaminated is the laminated substrate T obtained by bonding the target substrate W and the support substrate S with the adhesive agent G. However, the laminated substrate to be delaminated by the delamination device is not limited to the laminated substrate T. As an example, in the delamination device 141, in order to generate an SOI substrate, a laminated substrate obtained by bonding a donor substrate having an insulation film formed thereon and a target substrate may be used as a delamination target.

Figure 24:
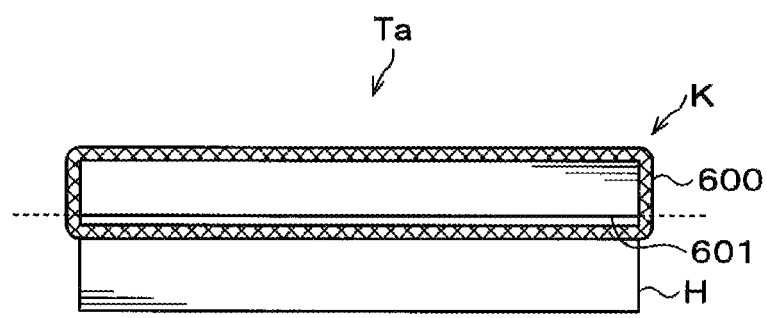
FIGS. 24 and 25 are schematic diagrams showing a manufacturing process of an SOI substrate.
Figure 25:
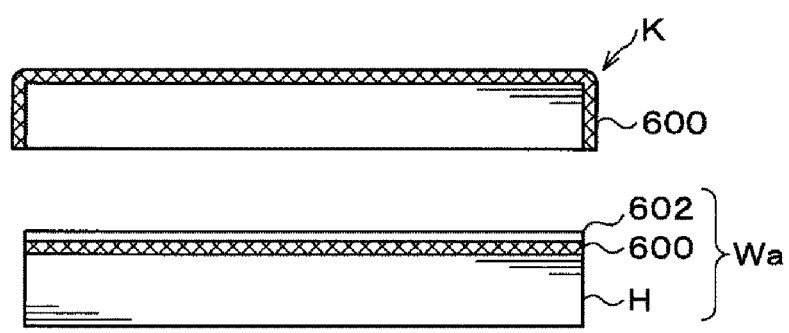

A method of manufacturing the SOI substrate will now be described with reference to FIGS. 24 and 25. FIGS. 24 and 25 are schematic views showing a manufacturing process of the SOI substrate. As shown in FIG. 24, a laminated substrate Ta used in forming the SOI substrate is formed by bonding a donor substrate K and a handle substrate H.

The donor substrate K includes an insulation film 600 formed thereon and a hydrogen ion injection layer 601 formed at a predetermined depth on a surface to be bonded to the handle substrate H. Examples of the handle substrate H may include a silicon wafer, a glass substrate, a sapphire substrate or the like.

In the delamination device 141, a mechanical impact is applied to the hydrogen ion injection layer 601 formed on the donor substrate K by, for example, pulling a portion of the outer periphery of the laminated substrate Ta in a state in which the donor substrate K is held by the first holding unit 310 and the handle substrate H is held by the second holding unit 350. Thus, as shown in FIG. 25, a silicon-silicon bond in the hydrogen ion injection layer 601 is disconnected so that a silicon layer 602 is delaminated from the donor substrate K. As a result, the insulation film 600 and the silicon layer 602 are transferred to an upper surface of the handle substrate H, thereby forming an SOI substrate Wa. The handle substrate H may be held by the first holding unit 310 and the donor substrate K may be held by the second holding unit 350.

In the aforementioned embodiments, there has been described an example where the target substrate W and the support substrate S are bonded together by the bonding agent G. Each of the bonding surfaces Wj and Sj may be divided into a plurality of regions. Bonding agents having different bonding forces may be applied to the respective regions.

In the aforementioned embodiments, there has been described an example where the laminated substrate T is held by the dicing frame F. However, the laminated substrate T needs not to be necessarily held by the dicing frame F.

According to the present disclosure, it is possible to efficiently and appropriately perform the delamination process of the target substrate and the support substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A delamination method for delaminating a laminated substrate which includes a first substrate and a second substrate bonded to each other, comprising:

adjusting, in a holding unit configured to hold the first substrate of the laminated substrate, a position of the laminated substrate held by the holding unit by a position adjusting unit by rotatably moving an arm portion of the position adjusting unit downward to make contact with a side surface of the laminated substrate and then disposing the holding unit at a predetermined height position;

disposing a sharp member of a delamination inducing unit at a predetermined height position, in the delamination inducing unit configured to form a delamination start part, in which the first substrate and the second substrate begin to be delaminated from each other, on the side surface of one end portion of the laminated substrate;

detecting a contact of the sharp member by bringing the sharp member into contact with the side surface of the one end portion of the laminated substrate;

inserting the sharp member into the side surface of the one end portion of the laminated substrate to form the delamination start part on the one end portion of the laminated substrate; and delaminating the second substrate from the first substrate by a plurality of suction movement units which sucks the second substrate of the laminated substrate and moves the second substrate away from the first substrate, such that delamination proceeds from the one end portion of the laminated substrate toward the other end portion thereof using the delamination start part as a starting point.

2. The method of claim 1, wherein the delamination inducing unit further includes a load cell configured to measure a force applied to the sharp member and a movement mechanism configured to move the sharp member, and at the operation of detecting the contact of the sharp member, the contact of the sharp member is detected based on one or both of a change of the force measured by the load cell and a change of the torque of a motor of the movement mechanism.

3. The method of claim 1, wherein the first substrate is a target substrate, the second substrate is a support substrate which supports the target substrate, and at the operation of detecting the contact of the sharp member, the sharp member is brought into contact with a side surface of the second substrate of the laminated substrate.

4. The method of claim 1, wherein the laminated substrate is formed by bonding the first substrate and the second substrate through a bonding agent, and at the operation of detecting the contact of the sharp member, the sharp member is brought into contact with a side surface of the bonding agent of the laminated substrate.

5. The method of claim 1, wherein in the operation of inserting the sharp member into the side surface of the one end portion of the laminated substrate, the holding unit is rotated.

6. The method of claim 1, wherein in the operation of delaminating the second substrate from the first substrate by the plurality of suction movement units, a first suction movement unit of the plurality of suction movement units, which sucks a peripheral edge portion of the second substrate at the one end portion, is moved in such a direction as to move the peripheral edge portion away from the first substrate while keeping a constant force applied to the first suction movement unit.

7. The method of claim 6, wherein in the operation of delaminating the second substrate from the first substrate by the plurality of suction movement units, a second suction movement unit of the plurality of suction movement units, which sucks a region of the second substrate positioned closer to a central portion of the second substrate than the peripheral edge portion of the second substrate, is moved in such a direction as to move the region away from the first substrate while keeping a constant force applied to the second suction movement unit.

8. A delamination device for delaminating a laminated substrate which includes a first substrate and a second substrate bonded to each other, comprising:

a holding unit configured to hold the first substrate of the laminated substrate;

a plurality of suction movement units configured to suck the second substrate of the laminated substrate and to move the second substrate away from the first substrate;

a position adjusting unit configured to adjust a position of the laminated substrate at the holding unit;

a delamination inducing unit provided with a sharp member and configured to form a delamination start part, in which the first substrate and the second substrate begin to be delaminated from each other, on a side surface of one end portion of the laminated substrate, by bringing the sharp member into contact with the side surface of the one end portion of the laminated substrate held in the holding unit; and a control device configured to control the holding unit, the plurality of suction movement units, the position adjusting unit and the delamination inducing unit so as to perform: adjusting a position of the laminated substrate held in the holding unit by the position adjusting unit by rotatably moving an arm portion of the position adjusting unit downward to make contact with the side surface of the laminated substrate and then disposing the holding unit at a predetermined height position; disposing the sharp member at a predetermined height position; detecting a contact of the sharp member by bringing the sharp member into contact with the side surface of the one end portion of the laminated substrate; inserting the sharp member into the side surface of the laminated substrate to form the delamination start part on the side surface of the one end portion of the laminated substrate; and delaminating the second substrate from the first substrate by the plurality of suction movement units such that delamination proceeds from the one end portion of the laminated substrate toward the other end portion thereof using the delamination start part as a starting point.

9. The device of claim 8, wherein the delamination inducing unit further includes a load cell configured to measure a force applied to the sharp member and a movement mechanism configured to move the sharp member, and the control device is configured to control the delamination inducing unit such that at the operation of detecting the contact of the sharp member, the contact of the sharp member is detected based on one or both of a change of the force measured by the load cell and a change of the torque of a motor of the movement mechanism.

10. The device of claim 8, wherein the first substrate is a target substrate, the second substrate is a support substrate which supports the target substrate, and the delamination inducing unit is configured to bring the sharp member into contact with a side surface of the second substrate of the laminated substrate.

11. The device of claim 8, wherein the laminated substrate is formed by bonding the first substrate and the second substrate through a bonding agent, and the delamination inducing unit is configured to bring the sharp member into contact with a side surface of the bonding agent of the laminated substrate.

12. The device of claim 8, further comprising:

a rotary mechanism configured to rotate the holding unit, wherein the control device is configured to control the rotary mechanism so as to rotate the holding unit in the operation of inserting the sharp member into the side surface of the laminated substrate.

13. The device of claim 8, wherein the plurality of suction movement units includes a first suction movement unit configured to suck a peripheral edge portion of the second substrate at the one end portion, the control device is configured to, at the operation of delaminating the second substrate from the first substrate by the plurality of suction movement units, keep a constant force applied to the first suction movement unit, and the control device is configured to control the first suction movement unit such that the first suction movement unit is moved in such a direction as to move the peripheral edge portion away from the first substrate.

14. The device of claim 13, wherein the plurality of suction movement units further includes a second suction movement unit configured to suck a region of the second substrate positioned closer to a central portion of the second substrate than the peripheral edge portion of the second substrate, the control device is configured to, at the operation of delaminating the second substrate from the first substrate by the plurality of suction movement units, keep a constant force applied to the second suction movement unit, and the control device is configured to control the second suction movement unit such that the second suction movement unit is moved in such a direction as to move the region away from the first substrate.

15. A delamination system provided with the delamination device of claim 8, comprising:

a first processing block configured to perform processes with respect to the laminated substrate and the first substrate; and a second processing block configured to perform processes with respect to the second substrate, wherein the first processing block includes a carry-in/carry-out station in which the laminated substrate and the first substrate are placed, a delamination station provided with the delamination device, and a first transfer region provided with a first transfer device which transfers the laminated substrate and the first substrate between the carry-in/carry-out station and the delamination station, and the second processing block includes a carry-out station in which the second substrate is placed, and a second transfer region provided with a second transfer device which transfers the second substrate with respect to the carry-out station.

* * * * *